US012642013B2

(12) United States Patent
Netzband et al.

(10) Patent No.: US 12,642,013 B2
(45) Date of Patent: May 26, 2026

(54) WAFER BONDING PROCESS WITH REDUCED OVERLAY DISTORTION

(71) Applicant: Tokyo Electron Limited, Tokyo (JP)

(72) Inventors: Christopher Michael Netzband, Albany, NY (US); Nathan Ip, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 356 days.

(21) Appl. No.: 18/450,083

(22) Filed: Aug. 15, 2023

(65) Prior Publication Data

US 2024/0063022 A1 Feb. 22, 2024

Related U.S. Application Data

(60) Provisional application No. 63/398,495, filed on Aug. 16, 2022.

(51) Int. Cl.
| | |
|---|---|
| H10P 10/00 | (2026.01) |
| H10P 72/78 | (2026.01) |
| H10P 74/20 | (2026.01) |
| H10P 95/90 | (2026.01) |

(52) U.S. Cl.
CPC ............ *H10P 10/128* (2026.01); *H10P 72/78* (2026.01); *H10P 74/203* (2026.01); *H10P 95/906* (2026.01)

(58) Field of Classification Search
CPC .............. H01L 21/187; H01L 21/3247; H01L 21/67092; H01L 21/6838; H01L 22/12; H01L 22/20
See application file for complete search history.

(56) References Cited

U.S. PATENT DOCUMENTS

| | | | |
|---|---|---|---|
| 10,438,918 | B2 | 10/2019 | Omori et al. |
| 10,964,563 | B2 | 3/2021 | Wada et al. |
| 11,721,596 | B2 | 8/2023 | Kohama |
| 11,735,465 | B2 | 8/2023 | Sugakawa et al. |
| 2014/0113433 | A1 | 4/2014 | Nguyen et al. |

(Continued)

FOREIGN PATENT DOCUMENTS

KR 20170070024 A 6/2017

OTHER PUBLICATIONS

International Search Report and Written Opinion, International Application No. PCT/US2023/030245, dated Dec. 4, 2023, 10 pages.

*Primary Examiner* — Alexander G Ghyka
(74) *Attorney, Agent, or Firm* — Slater Matsil, LLP

(57) ABSTRACT

An embodiment method includes determining an upper vacuum condition, a lower vacuum condition, a bonding gap distance, and a striker pressure condition based on measuring residual distortions from a previously bonded wafer. The method includes applying the upper vacuum condition to an upper wafer using an upper wafer holder, the upper vacuum condition applied to a backside of the upper wafer, and the upper wafer having a front side being opposite of the backside. The method includes applying the lower vacuum condition to a lower wafer using a lower wafer holder. The method includes positioning the front side of the upper wafer over the front side of the lower wafer to create the bonding gap distance between the upper wafer and the lower wafer and striking the backside of the upper wafer with a striker using the striker pressure condition to bond the front side of the upper wafer and the front side of the lower wafer together.

21 Claims, 12 Drawing Sheets

(56)         References Cited

U.S. PATENT DOCUMENTS

| 2017/0178931 | A1  | 6/2017  | Choi et al.           |
|--------------|-----|---------|-----------------------|
| 2020/0273835 | A1  | 8/2020  | Inamasu               |
| 2020/0365442 | A1  | 11/2020 | Sugakawa et al.       |
| 2021/0050243 | A1  | 2/2021  | Otsuka                |
| 2022/0013416 | A1  | 1/2022  | Ip                    |
| 2022/0187718 | A1* | 6/2022  | Zach ......... G01N 21/9501 |

* cited by examiner

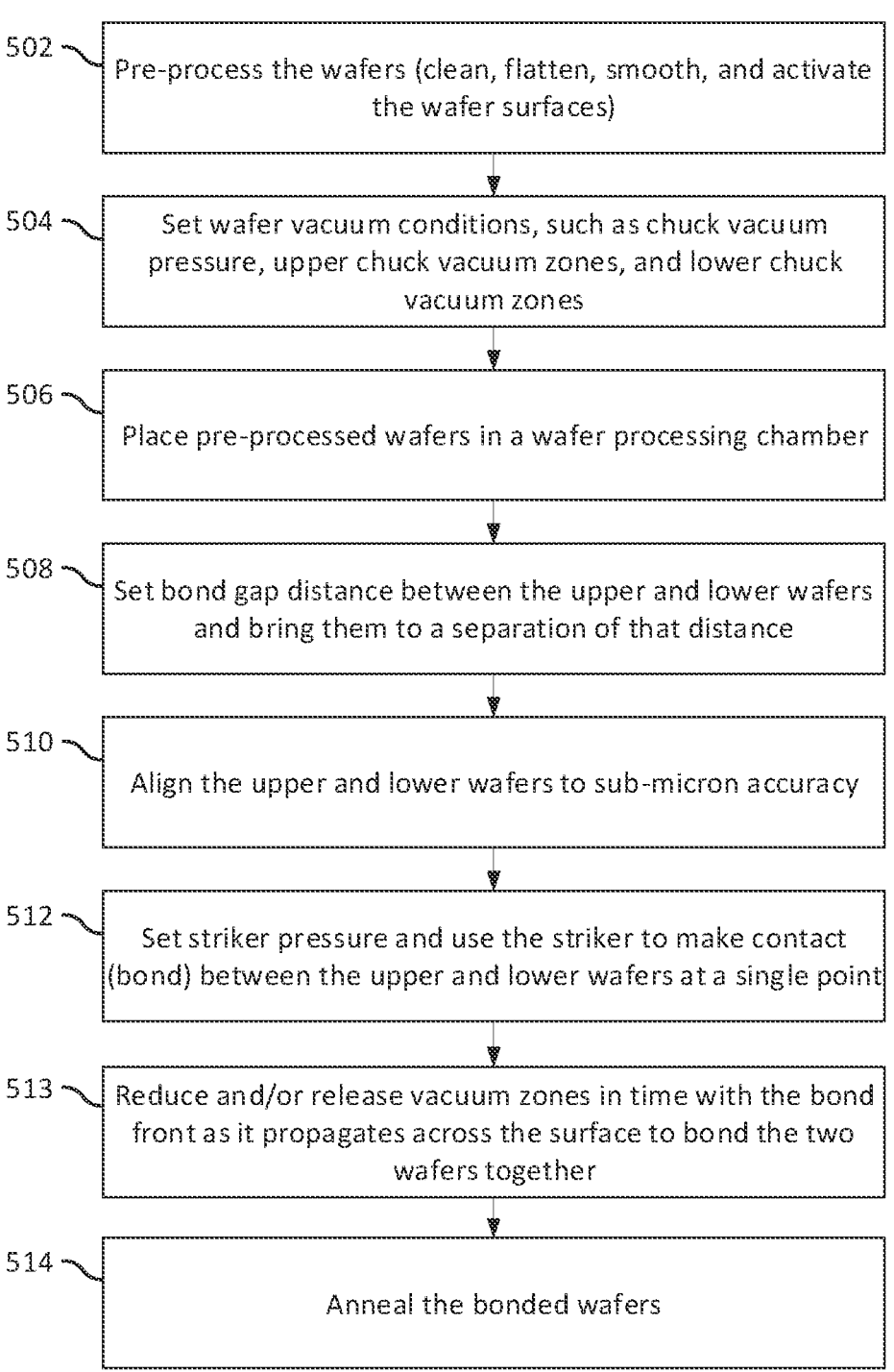

502 — Pre-process the wafers (clean, flatten, smooth, and activate the wafer surfaces)

504 — Set wafer vacuum conditions, such as chuck vacuum pressure, upper chuck vacuum zones, and lower chuck vacuum zones 506 — Place pre-processed wafers in a wafer processing chamber 508 — Set bond gap distance between the upper and lower wafers and bring them to a separation of that distance 510 — Align the upper and lower wafers to sub-micron accuracy 512 — Set striker pressure and use the striker to make contact (bond) between the upper and lower wafers at a single point 513 — Reduce and/or release vacuum zones in time with the bond front as it propagates across the surface to bond the two wafers together 514 — Anneal the bonded wafers

*Fig. 5*

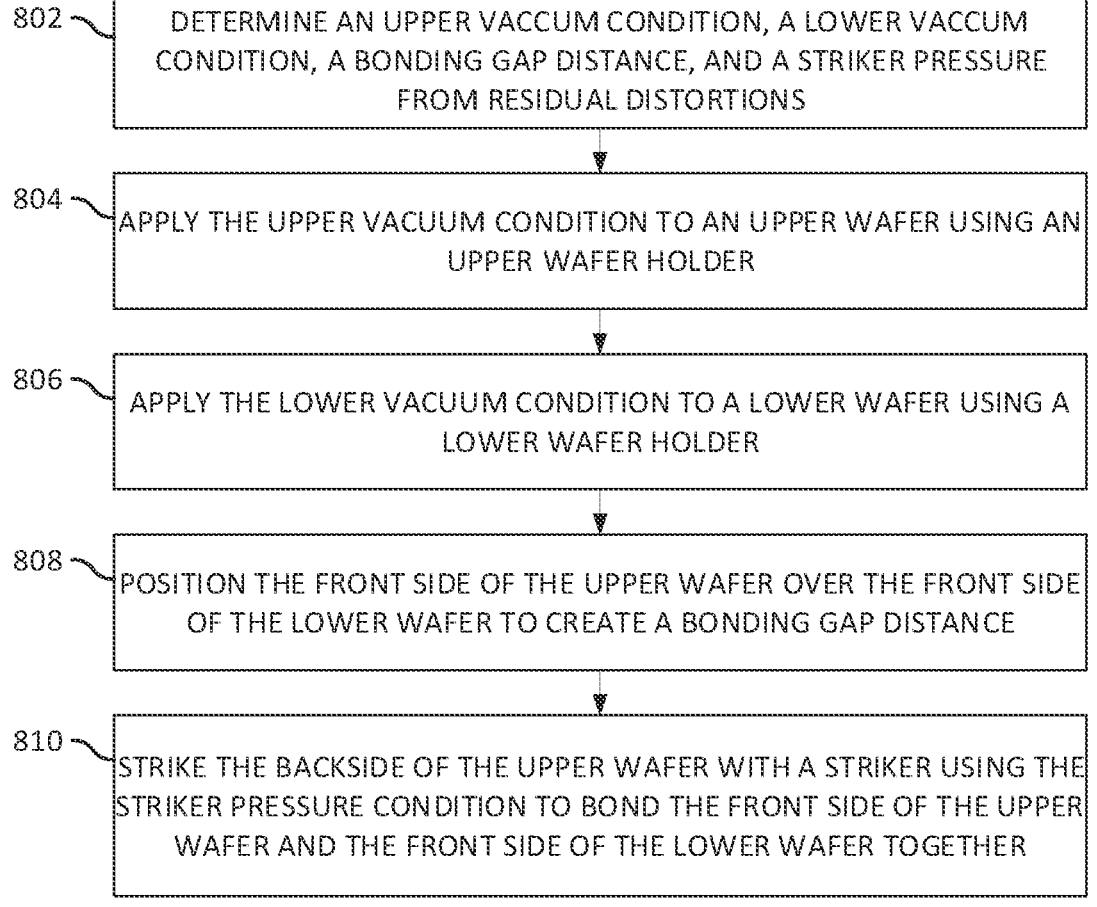

802 — DETERMINE AN UPPER VACCUM CONDITION, A LOWER VACCUM CONDITION, A BONDING GAP DISTANCE, AND A STRIKER PRESSURE FROM RESIDUAL DISTORTIONS

804 — APPLY THE UPPER VACUUM CONDITION TO AN UPPER WAFER USING AN UPPER WAFER HOLDER

806 — APPLY THE LOWER VACUUM CONDITION TO A LOWER WAFER USING A LOWER WAFER HOLDER

808 — POSITION THE FRONT SIDE OF THE UPPER WAFER OVER THE FRONT SIDE OF THE LOWER WAFER TO CREATE A BONDING GAP DISTANCE

810 — STRIKE THE BACKSIDE OF THE UPPER WAFER WITH A STRIKER USING THE STRIKER PRESSURE CONDITION TO BOND THE FRONT SIDE OF THE UPPER WAFER AND THE FRONT SIDE OF THE LOWER WAFER TOGETHER

*Fig. 8*

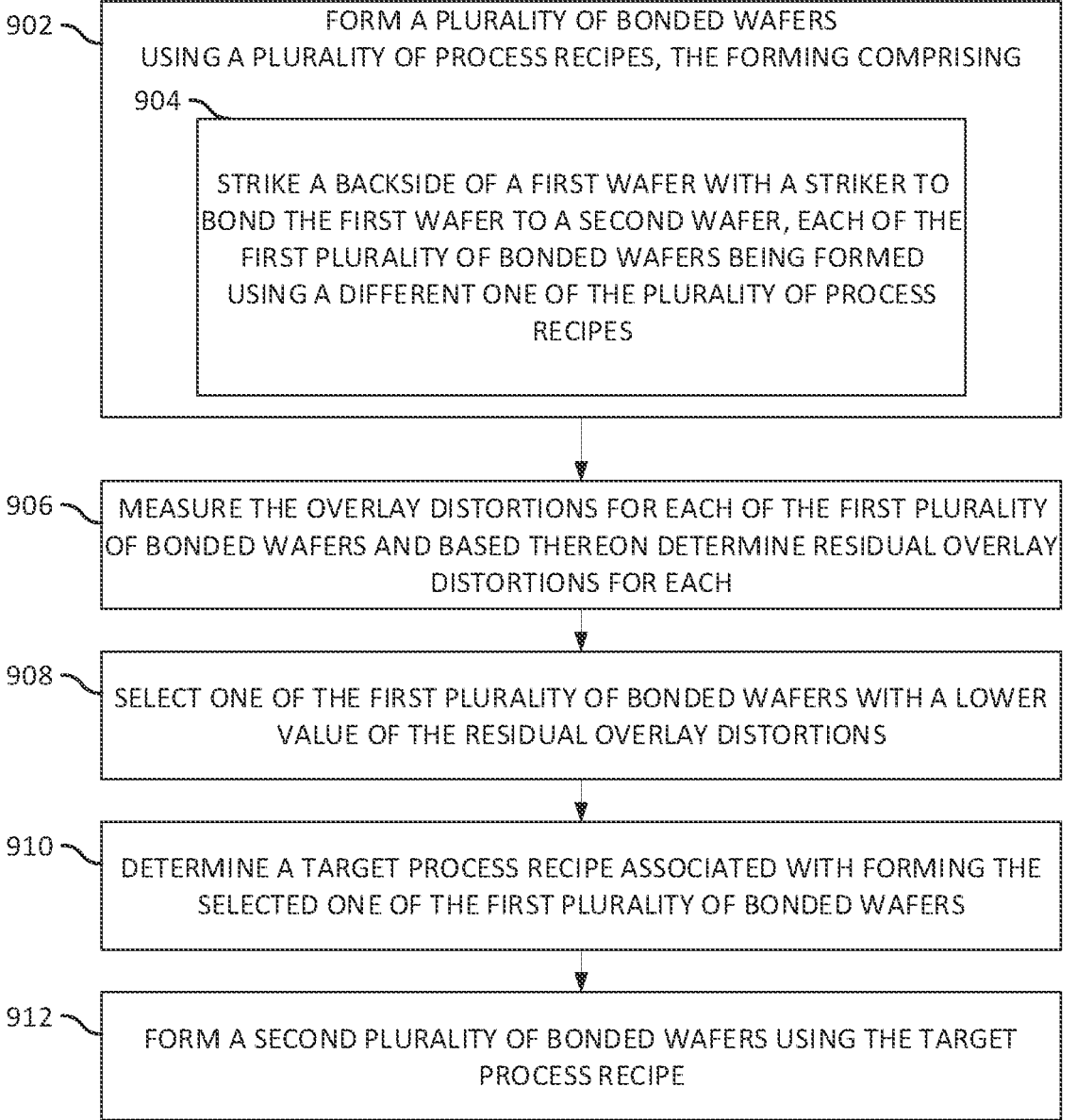

902 — FORM A PLURALITY OF BONDED WAFERS
USING A PLURALITY OF PROCESS RECIPES, THE FORMING COMPRISING

904 —
STRIKE A BACKSIDE OF A FIRST WAFER WITH A STRIKER TO
BOND THE FIRST WAFER TO A SECOND WAFER, EACH OF THE
FIRST PLURALITY OF BONDED WAFERS BEING FORMED
USING A DIFFERENT ONE OF THE PLURALITY OF PROCESS
RECIPES

906 — MEASURE THE OVERLAY DISTORTIONS FOR EACH OF THE FIRST PLURALITY
OF BONDED WAFERS AND BASED THEREON DETERMINE RESIDUAL OVERLAY
DISTORTIONS FOR EACH

908 — SELECT ONE OF THE FIRST PLURALITY OF BONDED WAFERS WITH A LOWER
VALUE OF THE RESIDUAL OVERLAY DISTORTIONS

910 — DETERMINE A TARGET PROCESS RECIPE ASSOCIATED WITH FORMING THE
SELECTED ONE OF THE FIRST PLURALITY OF BONDED WAFERS

912 — FORM A SECOND PLURALITY OF BONDED WAFERS USING THE TARGET
PROCESS RECIPE

*Fig. 9*

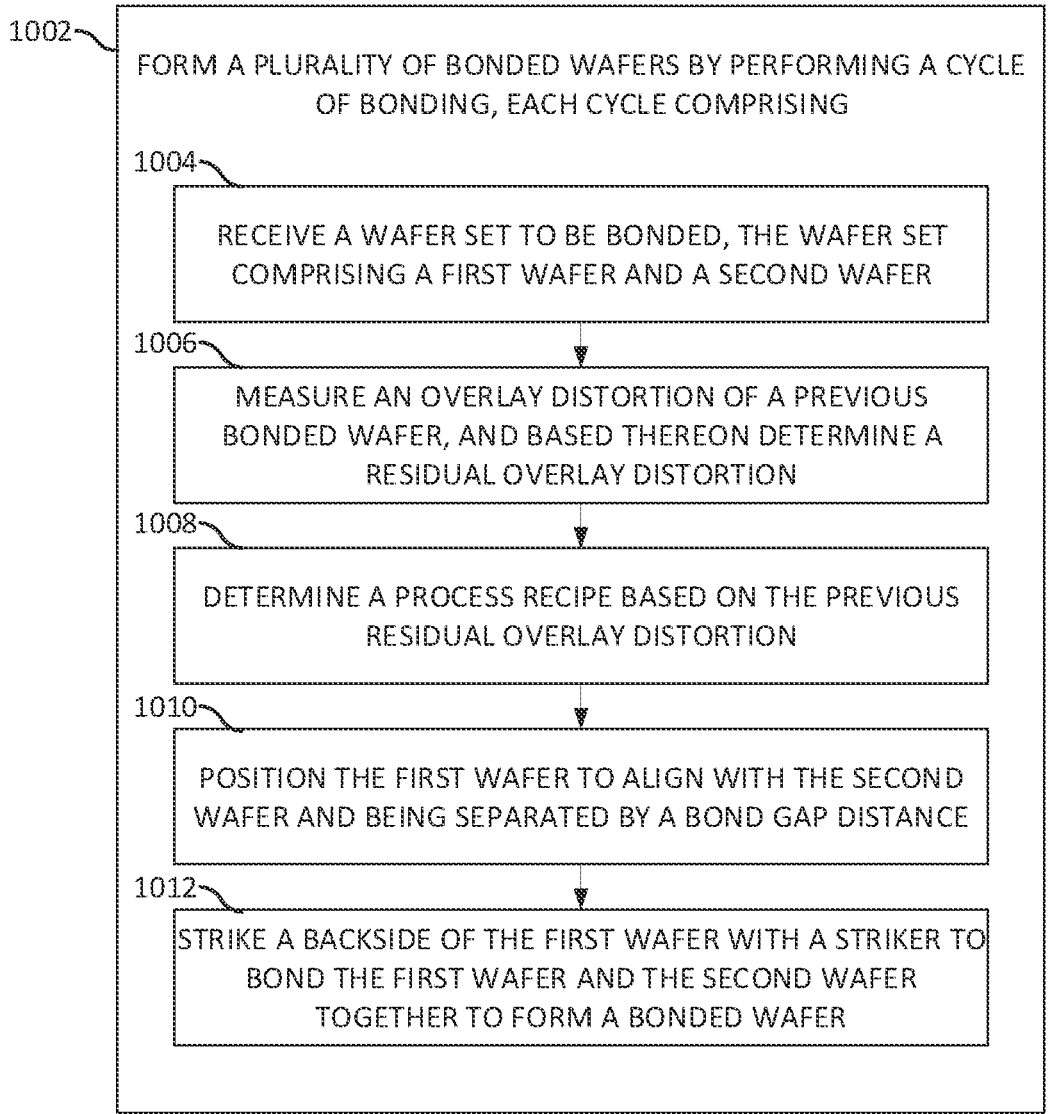

1002 — FORM A PLURALITY OF BONDED WAFERS BY PERFORMING A CYCLE OF BONDING, EACH CYCLE COMPRISING

1004 — RECEIVE A WAFER SET TO BE BONDED, THE WAFER SET COMPRISING A FIRST WAFER AND A SECOND WAFER

1006 — MEASURE AN OVERLAY DISTORTION OF A PREVIOUS BONDED WAFER, AND BASED THEREON DETERMINE A RESIDUAL OVERLAY DISTORTION

1008 — DETERMINE A PROCESS RECIPE BASED ON THE PREVIOUS RESIDUAL OVERLAY DISTORTION

1010 — POSITION THE FIRST WAFER TO ALIGN WITH THE SECOND WAFER AND BEING SEPARATED BY A BOND GAP DISTANCE

1012 — STRIKE A BACKSIDE OF THE FIRST WAFER WITH A STRIKER TO BOND THE FIRST WAFER AND THE SECOND WAFER TOGETHER TO FORM A BONDED WAFER

*Fig. 10*

WAFER BONDING PROCESS WITH REDUCED OVERLAY DISTORTION

CROSS-REFERENCE TO RELATED APPLICATIONS

This application claims the benefit of U.S. Provisional Application No. 63/398,495, filed on Aug. 16, 2022, which application is hereby incorporated herein by reference.

TECHNICAL FIELD

The present invention relates to the field of semiconductor manufacturing and, more specifically, to a wafer bonding process with reduced overlay distortion.

BACKGROUND

In the production of integrated circuits (ICs), precise alignment and bonding of multiple layers are crucial to ensure the functionality and performance of the final device. Overlay distortion, also known as misalignment, refers to the misplacement or mis-registration of patterns and features between different layers during the wafer bonding process. Overlay distortion can result in various issues such as reduced device yield, degraded electrical performance, and increased fabrication costs.

Existing wafer bonding techniques, such as direct wafer bonding, thermocompression bonding, and adhesive bonding, have been employed to achieve strong bonding between wafers. However, these methods often suffer from overlay distortion due to the inherent mechanical and thermal stresses that are generated during the bonding process. These stresses can cause warping, bending, or tilting of the bonded wafers, leading to misalignment of patterns and features which is known as overlay distortion.

SUMMARY

In accordance with a preferred embodiment of the present invention, a method includes determining an upper vacuum condition, a lower vacuum condition, a bonding gap distance, and a striker pressure condition based on measuring residual distortions from a previously bonded wafer. The method includes applying the upper vacuum condition to an upper wafer using an upper wafer holder, the upper vacuum condition applied to a backside of the upper wafer, and the upper wafer having a front side being opposite of the backside. The method includes applying the lower vacuum condition to a lower wafer using a lower wafer holder, the lower vacuum condition applied to a backside of the lower wafer, and the lower wafer having a front side being opposite of the backside. The method includes positioning the front side of the upper wafer over the front side of the lower wafer to create the bonding gap distance between the upper wafer and the lower wafer. And the method includes striking the backside of the upper wafer with a striker using the striker pressure condition to bond the front side of the upper wafer and the front side of the lower wafer together.

A wafer bonding method to reduce overlay distortions includes forming a first plurality of bonded wafers using a plurality of process recipes, the forming includes for each one of the first plurality of bonded wafers, striking a backside of a first wafer with a striker to bond the first wafer to a second wafer, each of the first plurality of bonded wafers being formed using a different one of the plurality of process recipes. The method includes measuring overlay distortions for each of the first plurality of bonded wafers, and based thereon determining residual overlay distortions for each of the first plurality of bonded wafers. The method includes selecting one of the first plurality of bonded wafers with a lower value of the residual overlay distortions. The method includes determining a target process recipe associated with forming the selected one of the first plurality of bonded wafers. And the method includes forming a second plurality of bonded wafers using the target process recipe.

An adaptive wafer bonding method to reduce overlay distortions includes forming a plurality of bonded wafers by performing a cycle of bonding, each cycle includes receiving a wafer set to be bonded, the wafer set including a first wafer and a second wafer. Each cycle includes measuring an overlay distortion of a previous bonded wafer, and based thereon determining a residual overlay distortion of the previous bonded wafer. Each cycle includes determining a process recipe based on the previous residual overlay distortion. Each cycle includes positioning the first wafer to align with the second wafer and being separated by a bond gap distance. And each cycle includes striking a backside of the first wafer with a striker to bond the first wafer and the second wafer together to form a bonded wafer.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 is a flowchart of a direct bonding method being modified;

FIG. 8 illustrates a flow chart illustrating a method for direct wafer bonding;

FIG. 9 illustrates a flow chart illustrating a method for determining a target process recipe for direct wafer bonding to reduce residual overlay distortions; and FIG. 10 illustrates a flow chart illustrating a method for determining a target process recipe for direct wafer bonding in an adaptive method.

DETAILED DESCRIPTION OF ILLUSTRATIVE EMBODIMENTS

Figures 1A, 1B, 1C, 1D:
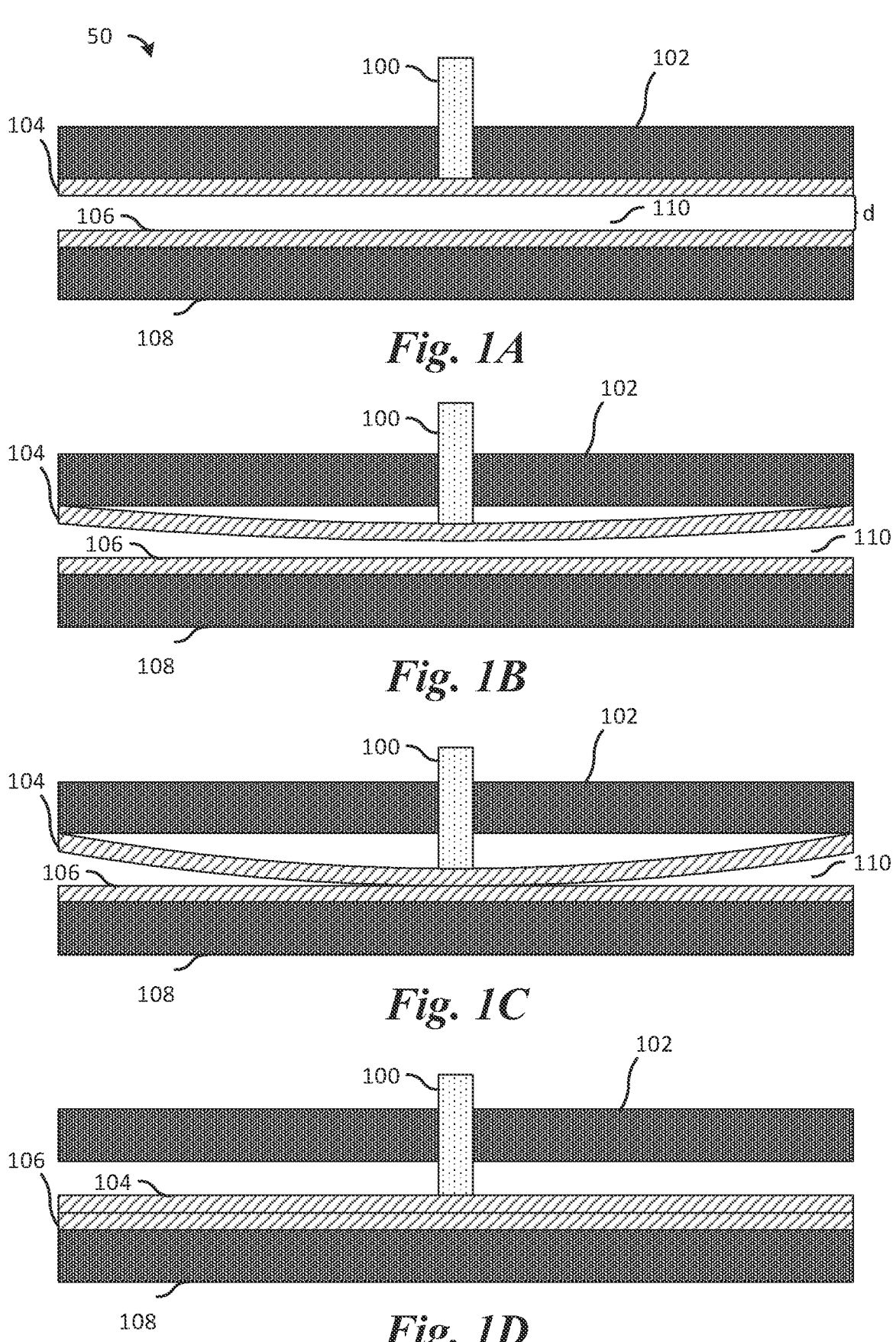
FIG. 1A is a schematic diagram of a cross-sectional view of a direct bonding method showing the initial alignment and separation distance of an upper wafer and a lower wafer to be bonded.
FIG. 1B is a schematic diagram of a cross-sectional view of a direct bonding method showing a striker beginning to bring the upper wafer to the bottom wafer to be bonded.
FIG. 1C is a schematic diagram of a cross-sectional view of a direct bonding method showing the striker has brought the upper and lower wafer into direct contact causing a bond front to propagate across the wafer's surfaces.
FIG. 1D is a schematic diagram of a cross-sectional view of a direct bonding method showing the combined wafer after the pre-bonding process at room temperature step of the conventional direct bonding method.

Wafer bonding methods are employed in a wide variety of semiconductor process applications to manufacture semiconductor devices. Some examples of semiconductor process applications that use wafer bonding methods include the fabrication of integrated circuits (ICs), the fabrication of microelectromechanical systems (MEMS) and nanoelectromechanical systems (NEMS), and the stacking of many processed layers (3D-integration) of microelectronics. There are many different wafer bonding methods, including direct bonding (also called fusion bonding), thermocompression bonding, and adhesive bonding.

The bond quality between the wafers relies on the uniformity and integrity of the bond, as well as the preservation of wafer alignment throughout the wafer bond interfaces. Overlay distortion, also known as misalignment, refers to the misplacement or misregistration of patterns and features between different surface layers during the wafer bonding process. Overlay distortion can result in various issues such as reduced device yield, degraded electrical performance, and increased fabrication costs. The minimum overlay distortion achievable is generally dependent on the fabrication hardware.

This disclosure describes a wafer bonding method. In various embodiments, the wafer bonding method generates a direct bonding recipe for a direct bonding method that produces an optimized direct bonding recipe. The direct bonding recipe minimizes overlay distortions by identifying and adapting bonding parameters. By systematically varying bonding parameters of best known recipes, the wafer bonding method refines (or tunes) the best known recipes and produces a new wafer bonding process that minimizes wafer overlay distortions. As a result, overlay distortions are reduced and semiconductor manufacturers do not have to purchase expensive new wafer processing tools to accomplish similar results. Another result of reducing overlay distortions in bonded wafers, is an increase in yield of the semiconductor devices fabricated.

This disclosure begins with a description of the wafer bonding process called direct bonding, and then proceeds to show the bonding steps of the direct bonding process in FIGS. 1A-D. Different examples of linear overlay distortions that may occur from bonding a pair of wafers in a direct bonding method will be illustrated using FIGS. 2A-F. An example wafer holder with various configurable chuck vacuum zones will be then described with FIGS. 3A-B. A flowchart for a linear calibration and an adaptive version of the wafer bonding method will be described using FIGS. 4 and 6. An embodiment wafer processing tool using direct bonding will be described using FIG. 7.

Direct bonding (also called fusion bonding) is a wafer bonding method where two wafer's surfaces are brought into direct contact and are bonded without the use of any adhesives, or any other intermediate layers. Direct bonding between two wafers is a result of chemical bonds between the two surfaces of the wafers. The chemical bonds that form may be a result of van der Waals bonds, or covalent bonds. A direct bonding method includes the steps of wafer preprocessing, pre-bonding that involves aligning and positioning the wafers on each other, bonding, and annealing. The wafer surfaces should be sufficiently clean, flat, and smooth for good bonding. Nevertheless, bonding defects may occur when the wafers are bonded, which can cause device failure in later processing steps. An overlay distortion is one type of bonding defect.

FIGS. 1A-D illustrates cross-sectional views of wafers during a pre-bonding process for bonding wafers 50. The wafers 50 include an upper wafer 104 and a lower wafer 106, which are to be bonded together. As illustrated in FIGS. 1A-1D, the wafers 50 are positioned within a wafer bonding tool, which includes an upper wafer holder 102, a lower wafer holder 108, a gap 110 separating the upper wafer 104 and the lower wafer 106, a striker 100, and a bond gap distance d (which separates the upper wafer 104 from the lower wafer 106, initially in FIG. 1A). The upper wafer 104 is held to the upper wafer holder 102 by pressure difference generated by applying vacuum between the upper wafer 104 and the upper wafer holder 102. Similarly, the lower wafer 106 is held to the lower wafer holder 108 by vacuum.

FIG. 1A depicts the initial configuration of the wafers 50 after loading, aligning, and positioning the upper wafer 104 and the lower wafer 106 such that the wafers 50 are separated by the bond gap distance d.

FIG. 1B illustrates the start of the process of using the striker 100 to bring the upper wafer 104 into direct contact with the lower wafer 106.

Once the wafers have been properly aligned and brought to a separation of the bond gap distance d, the striker 100 is applied to bring the wafers into direct contact. During this process, the upper wafer 104 is not fully released by the upper wafer holder 102 causing a bowing of the upper wafer 104. The gap 110 begins to be squeezed out from between the upper wafer 104 and the lower wafer 106. In an embodiment, the gap 110 separating the wafers 50 may be air and could also be inert gas such as argon, nitrogen in different embodiments. In an embodiment, the gap 110 separating the two wafers 50 may include a residue cleaning solution leftover from the pre-processing step. In an embodiment, the striker 100 is integrated with the lower wafer holder 108 and the bonding is initiated by striking the lower wafer 106 towards the upper wafer 104.

Following the process of striking the upper wafer 104 with the striker 100, the upper wafer 104 makes direct contact with the lower wafer 106 within a smaller area as illustrated in FIG. 1C. After the upper wafer 104 contacts the lower wafer 106, a bonding front propagates across the surface of the upper and lower wafers 104 and 106 originating from the region of contact. As the bond front propagates, the upper wafer 104 is released from the upper wafer holder 102 such that the entire surface of the upper wafer 104 contacts with the entire surface of the lower wafer 106. In addition, as the direct bonding front propagates across the surface, the gap 110 separating the wafers is pushed out from between the two wafers.

The bonds that are formed between the upper wafer 104 and the lower wafer 106 are based on intermolecular interactions that may be a result of van der Waals forces, hydrogen bonds, or strong covalent bonds.

FIG. 1D illustrates that the upper wafer 104 and the lower wafer 106 have bonded to form a bonded wafer. The striker 100 brought the upper wafer 104 and the lower wafer 106 into contact, and the bonding front propagated across their surfaces so that the upper and lower wafers are no longer separated by a medium and form a bonded wafer. Typically, after forming the bonded wafer, the bonded wafer will be exposed to elevated temperatures in an annealing process to help strengthen the bond between the two wafers. In some embodiments, only surface forces may maintain the wafers together until the annealing. After annealing, the direct bonding process is complete and any overlay distortions that have resulted from the bonding of the two wafers can no longer be mitigated.

Overlay distortions result from the direct bonding method in many ways, and they may be classified as from linear distortions, or from nonlinear distortions (called residuals). Linear distortions can be broken down into three distinct categories: translational distortion, rotational distortion, or dilation distortion. Linear distortions are generally easier to prevent and account for unlike nonlinear distortions, which can become a significant portion of the distortions. Embodiments of this application describe different techniques to reduce overlay distortions specifically arising from residuals.

Generally, the same best known recipe is used for all of the wafers, thus any wafer overlay distortions that result from the direct bonding method remain unmitigated and propagate to all wafers bonded using that recipe. By improving the direct bonding recipe, wafer overlay distortions are reduced, and the new recipe can be used for all future direct bonding performed by a particular wafer bonding tool.

Overlay distortions can be measured using a scanner to scan wafers that have been patterned. Using measurements of deviations of the patterned wafers, the scanner determines overlay distortions by generating distortion maps. Examples of linear overlay distortions and how the overlay distortions appear are illustrated in FIGS. 2A-F.

FIGS. 2A-F illustrates two wafers that are patterned and the various different kinds of linear overlay distortions that may occur after bonding.

Figure 2A:
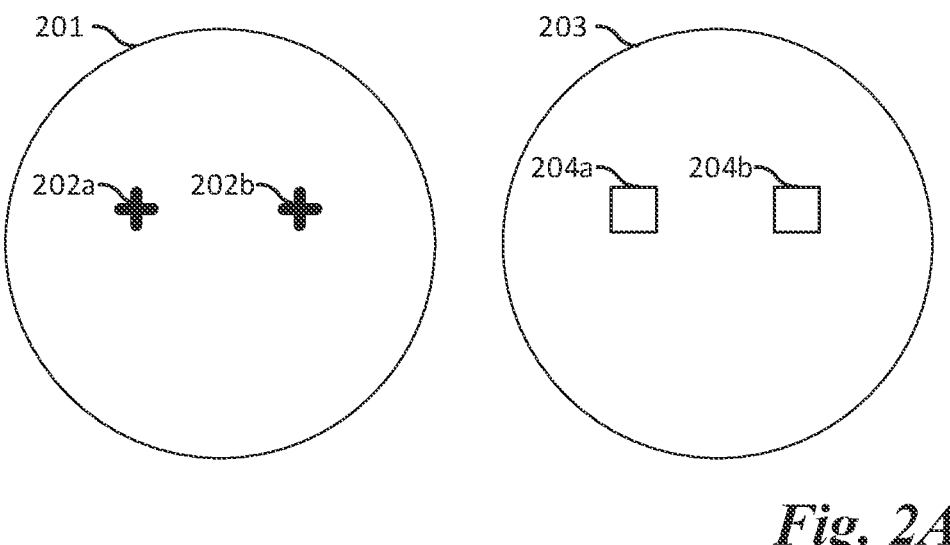
FIG. 2A is a schematic diagram of two wafers that are patterned to enable overlay distortions to be measured by a scanner once the wafers have been bonded.

FIG. 2A is a schematic diagram of two wafers that are patterned to enable overlay distortions to be measured by a scanner once the wafers have been bonded using a direct bonding method. The wafers in FIG. 2A have not been bonded. Illustrated in FIG. 2A is a first wafer 201, which is patterned with a left cross 202a and a right cross 202b, and a second wafer 203, which is patterned with a left square 204a and a right square 204b. Once the first wafer 201 and the second wafer 203 are bonded together, the alignment of the patterning (202a-b and 204a-b) can be used to measure overlay distortions.

Figure 2B:
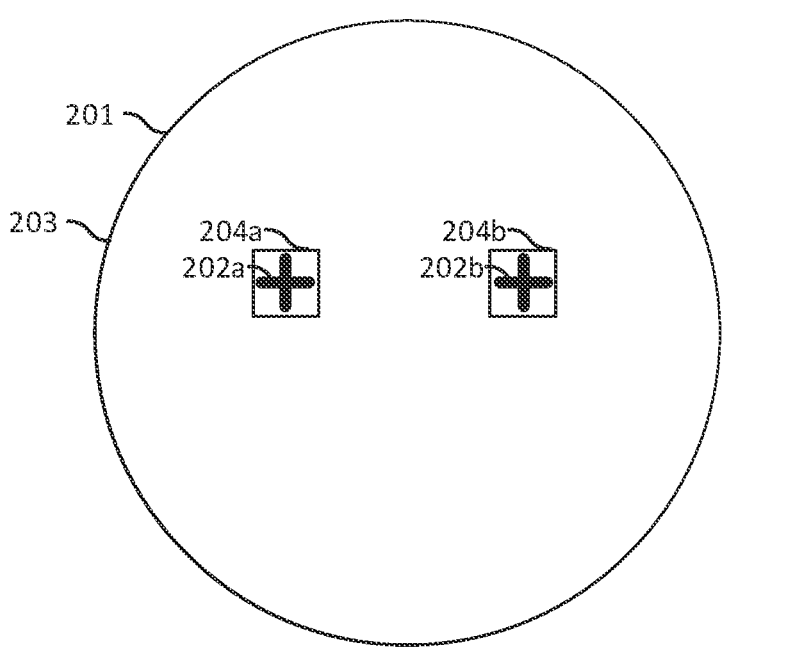
FIG. 2B is a schematic diagram of two wafers that have been bonded using a direct bonding method that resulted with virtually no overlay distortions.

FIG. 2B illustrates an example bonded wafer where there are no overlay distortions. The first wafer 201 has been bonded with the second wafer 203 and the left cross 202a is perfectly aligned with left square 204a and the right cross 202b is perfectly aligned with right square 204b. FIG. 2B is the ideal scenario where no observable overlay distortion is present in the bonded wafer.

Figure 2C:
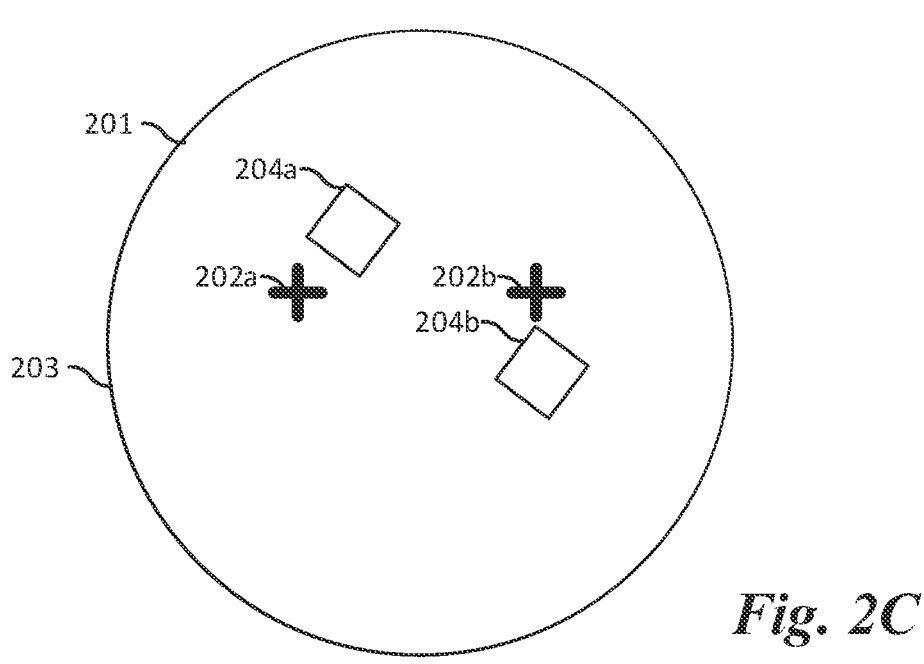
FIG. 2C is a schematic diagram of two wafers that have been bonded using a direct bonding method that the overlay distortion present is a result of a rotation of one of the wafers.

FIG. 2C illustrates the case of a rotational distortion between the bonded wafers, which is a linear overlay distortion. Rotational distortions are a result of differences in alignment between the upper and lower chuck in the direct bonding tool and variations in wafer handling between upper and lower wafers. In this embodiment, the center of the first wafer 201 and the center of the second wafer 203 are aligned, and there is a rotation causing a misalignment of the left cross 202a with the left square 204a as well as a misalignment of the right cross 202b with the left square 204b. These factors lead the scanner to determine that the overlay distortion is a result of a rotational distortion.

Figure 2D:
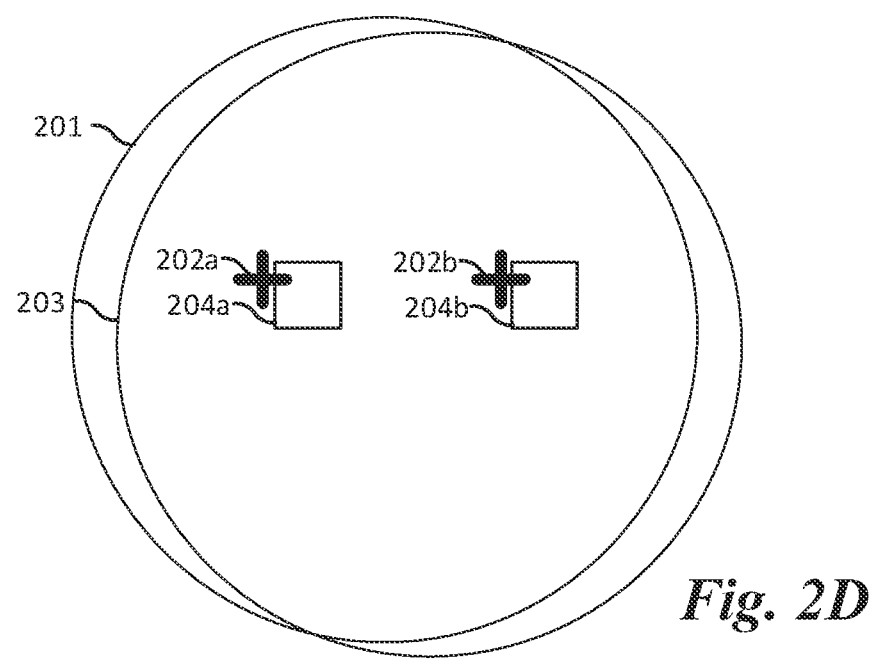
FIG. 2D is a schematic diagram of two wafers that have been bonded using a direct bonding method that the overlay distortion present is a result of a translation of one of the wafers.

FIG. 2D illustrates the case of a translational distortion between the bonded wafers, which is a linear overlay distortion. Translational distortions are a result of differences in alignment between the upper and lower chuck in the direct bonding tool and variations in wafer handling between upper and lower wafers. In this embodiment, the center of the first wafer 201 and the center of the second wafer 203 are not aligned. There is also an equidistance from the center of the left cross 202a to the center of the left square 204a and the center of the right cross 202b to the center of the right square 204b. These factors lead the scanner to determine that the overlay distortion is a result of a translational distortion.

Figure 2E:
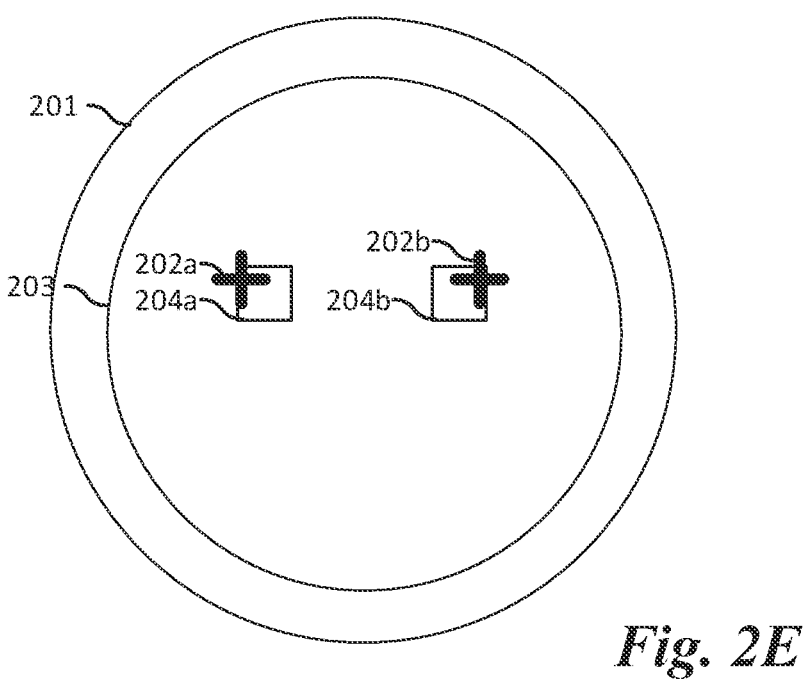
FIG. 2E is a schematic diagram of two wafers that have been bonded using a direct bonding method that the overlay distortion present is a result of a dilation of one of the wafers.

FIG. 2E illustrates the case of a dilation distortion between the bonded wafers, which is a linear overlay distortion. Dilation distortions are a result of the wafers contracting or expanding during the direct bonding process. Additional dilation distortions may result from each wafer having a different coefficient of thermal expansion (CTE), which would cause the wafers to expand at different rates during the annealing process. In this embodiment, the center of the first wafer 201 and the center of the second wafer 203 are aligned. The outer edges of the two wafers do not align. There is also an equidistance from the center of the left cross 202a to the center of the left square 204a and the center of the right cross 202b to the center of the right square 204b, but each being an equidistance towards the center of the wafers. These factors lead the scanner to determine that the overlay distortion is a result of a dilation distortion.

Figure 2F:
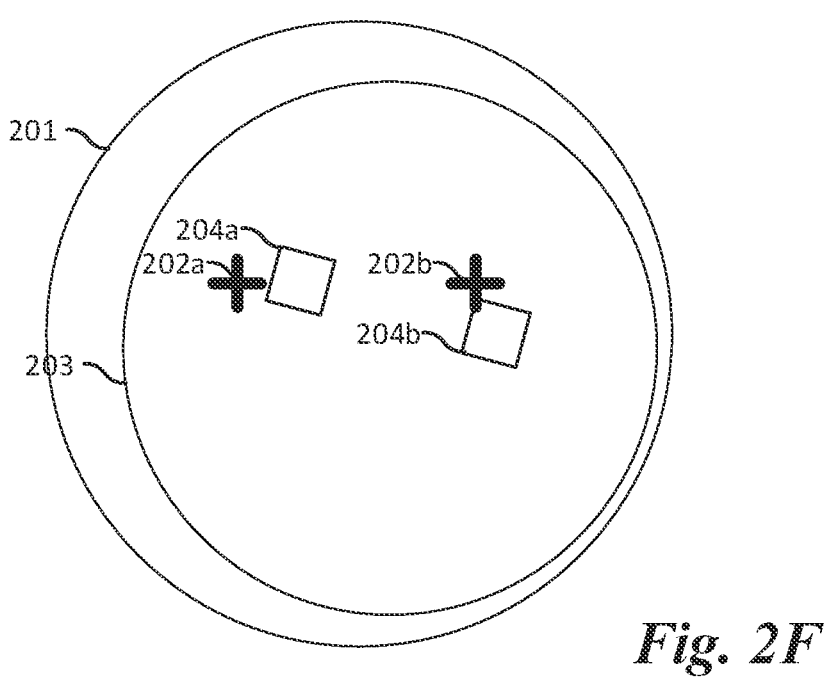
FIG. 2F is a schematic diagram of two wafers that have been bonded using a direct bonding method that the overlay distortion present is a result of a combination of a rotation, a translation, and a dilation of one of the wafers.

FIG. 2F illustrates a case of all linear forms of overlay distortions being present. The resulting bonded wafer of FIG. 2F is from a combination of rotational, translational, and dilation distortions. Second wafer 203 has been dilated, which is evident from the outer edges of the two wafers not aligning. Second wafer 203 has been translated, which is evident from the center of the wafers not aligning. And second wafer 203 has been rotated, which is evident from the left square 204a being approximately level with the left cross 202a, while the right square 204b is below the right cross 202b.

Any overlay distortion present in a bonded wafer that is not described by the linear overlay distortions illustrated in FIGS. 2A-F is a nonlinear overlay distortion. Nonlinear overlay distortions are also called residuals. The wafer bonding method of this disclosure reduces the residuals of direct bonding methods. The reduction of the residuals is accomplished by identifying and changing certain bonding parameters of the direct bonding recipe.

Figure 3A:
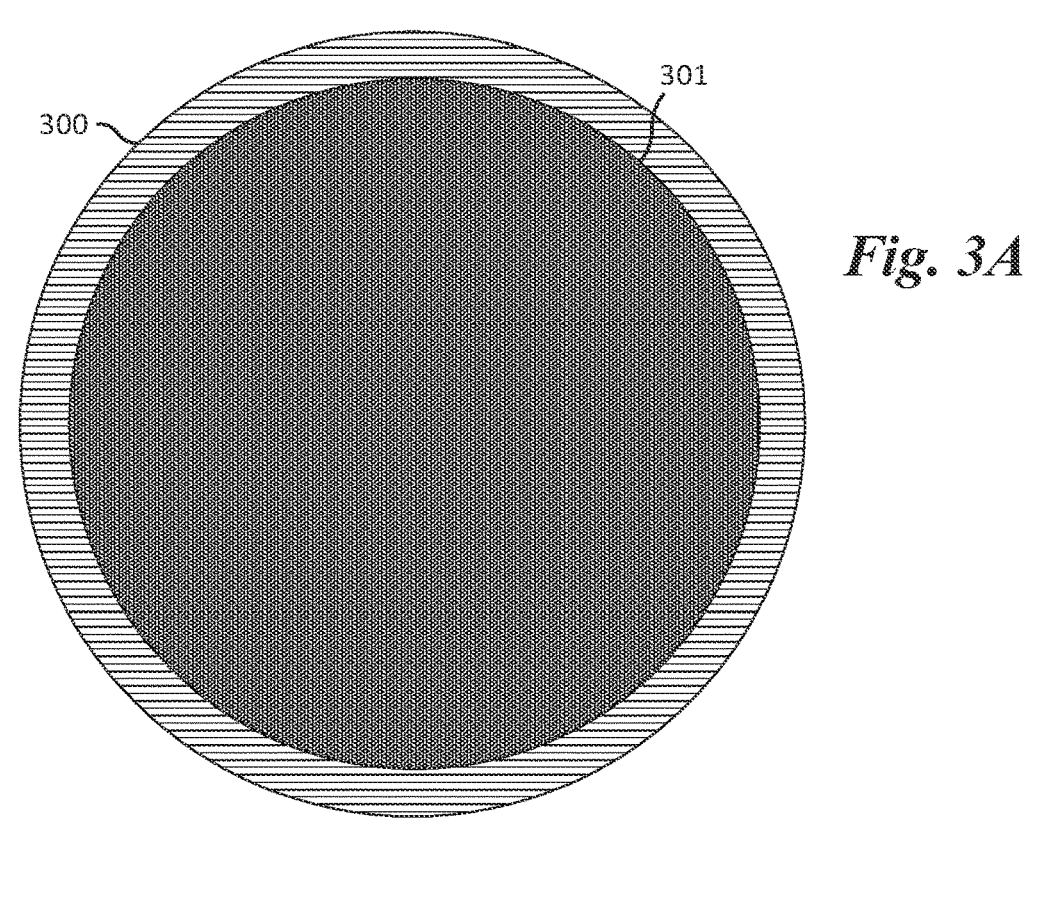
FIG. 3A is a schematic diagram of a wafer holder that is a vacuum chuck that has all of the chuck vacuum zones active at the edge of the wafers, in an embodiment.
Figure 3B:
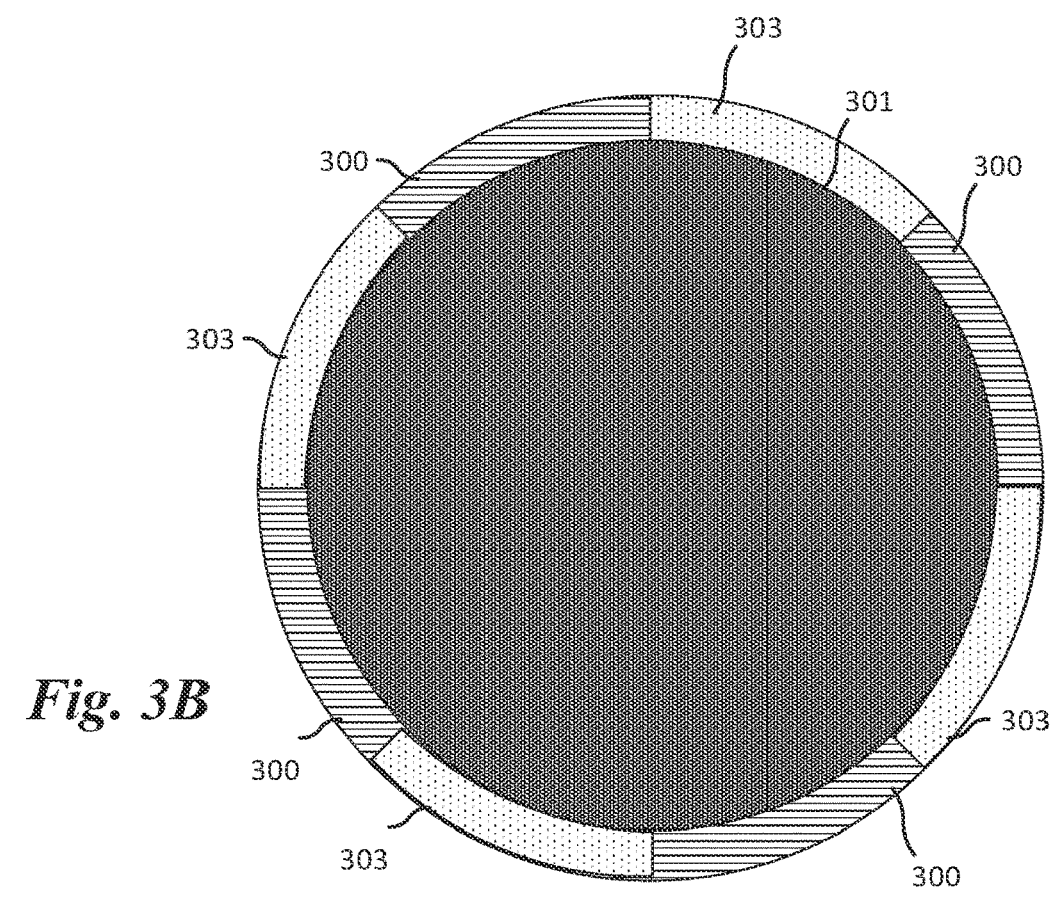
FIG. 3B is a schematic diagram of a wafer holder that is a vacuum chuck that has only half of the edge vacuum zones active, in an embodiment.

FIGS. 3A-B illustrate a vacuum chuck that may be used as the upper and lower wafer holders in an embodiment. A vacuum chuck holds a wafer by using a vacuum to pump the air out of cavities located behind the vacuum chuck so that air pressure will hold the wafer in place. The cavities of the vacuum chuck are called the vacuum zones, such as the upper wafer holder vacuum zones, and different zones can be configured to be active or not. FIGS. 3A-B illustrate two of the bonding parameters that may be varied to minimize residuals in a direct bonding method. In an embodiment, the vacuum zones illustrated in FIGS. 3A-B are just one possible zone configuration. In an embodiment, the vacuum zone configuration could include multiple rings of vacuum from the center to the edge of the vacuum chuck (while FIG. 3B shows only two), and these rings can be segmented further depending on how fine of a vacuum control is desired (such as the segmentation of the outer ring shown in FIG. 3B).

Referring to FIG. 3A, the vacuum chuck 301 can be either the lower wafer holder 108, or the upper wafer holder 102 of FIG. 1. One of the variable bonding parameters in the embodiment direct bonding method is the configuration of the vacuum zones of the vacuum chuck. The vacuum zones may be active or inactive. When the vacuum zone is active, vacuum is applied between the wafer and the chuck so as to attract the wafer to the chuck. Either or both of the wafers, i.e., the upper wafer holder 102 and the lower wafer holder 108 may include configurable vacuum zones. FIG. 3A illustrates all of the vacuum zones at the edge of the vacuum chuck 301 in an active state 300, which is called the all edge configuration.

Referring to FIG. 3B, the vacuum chuck 301 can be either the lower wafer holder 108, or the upper wafer holder 102 of FIG. 1. In FIG. 3B, only half of the vacuum zones are in an active state 300, and the other vacuum zones are not active 303. This use case may be referred as the edge diagonal configuration. The same vacuum chuck can be operated all edge or edge diagonal configuration. In various embodiments, the percentage of inactive zones may be used as a bonding parameter. In FIG. 3B, this percentage is about 50% but in other embodiments, this percentage may be designed to vary between 0% to 80% as an example.

Figure 4:
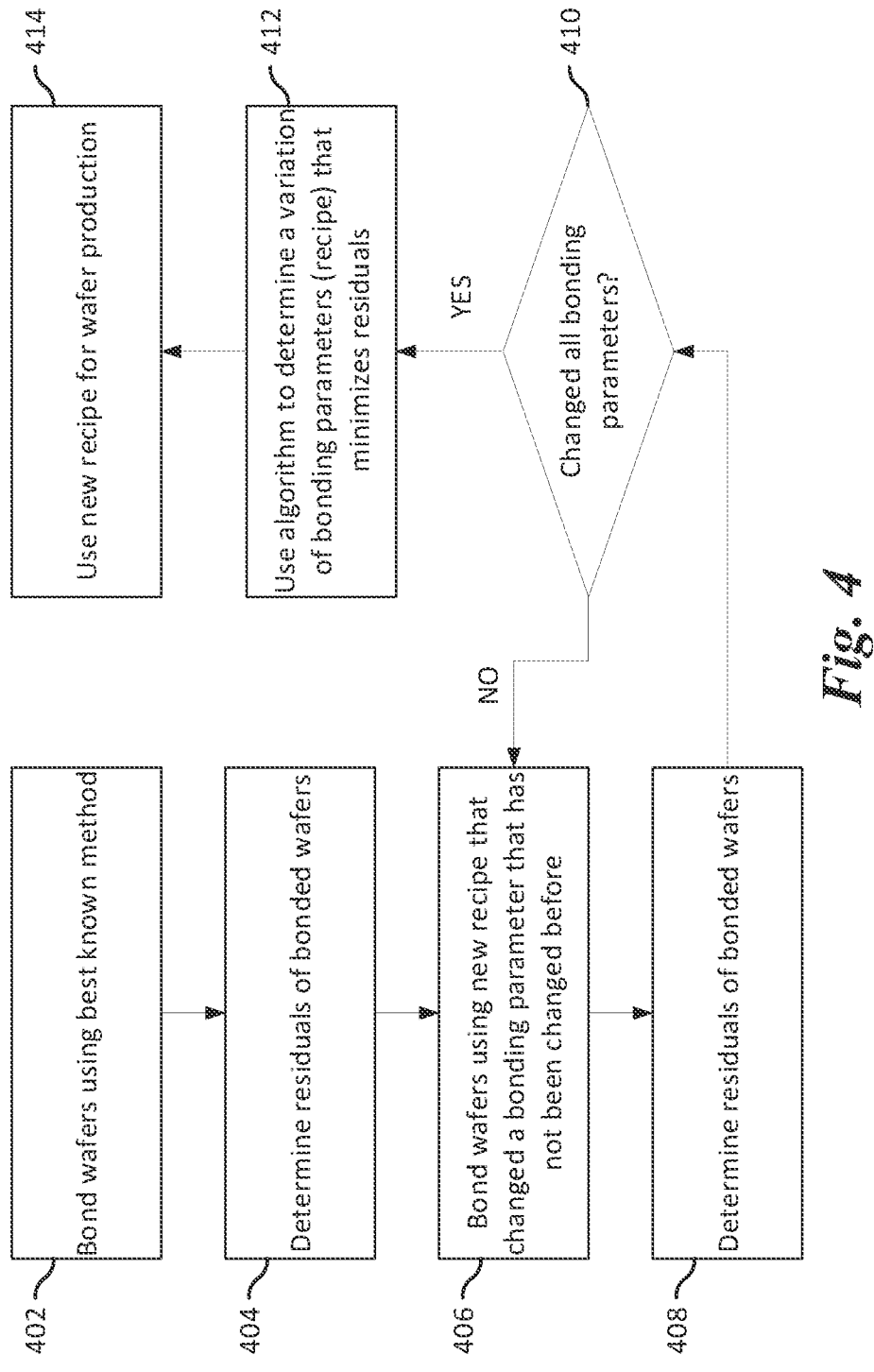
FIG. 4 is a flowchart of a wafer bonding method to reduce overlay distortions in accordance with embodiments.

FIG. 4 is a flowchart of a tuning wafer bonding method to reduce overlay distortions in accordance with an embodiment of this application.

The method begins in box 402, where two wafers are bonded using a baseline recipe of a direct bonding method for bonding the two wafers. In an embodiment, the bonding method used in box 402 is the wafer bonding method to be described in more detail using the flowchart of FIG. 5.

FIG. 5 is a flowchart of a starting direct bonding method. FIG. 5 could represent all the steps occurring in box 402 of FIG. 4.

In box 502, the wafers are pre-processed in order to clean, flatten, smooth, and activate the surface of the wafers. Wafer pre-processing may be done to improve the possible bond strength between two wafers intended to be bonded. The wafers are flattened and smoothed to increase the possible bonding surface area and to ensure there are no large gaps between the two wafers where contaminants may become trapped. If the wafers are sufficiently smoothed and flattened, the wafers will start to bond as soon as they make atomic contact. The wafers may be cleaned to make sure that the two wafers are free of impurities that cause particle, organic, or ionic contamination. The cleaning may be accomplished through a variety of treatments, such as plasma treatments or UV/ozone cleaning, or a wet chemical cleaning procedure. Surface activation tunes the surface energy and friction along the bond interface and can change distortions during the bonding process. The activation process (or surface activation) is a distinct step that involves bombarding the surface of the wafer with plasma to modify the surface. This modification creates active sites that terminate with dangling bonds. The active sites are where bonding occurs and increasing the number of bonding sites improves the bonding energy. The amount and uniformity of bonding sites also impacts propagation rates and subsequently distortion.

After the wafers have been pre-processed to produce pre-processed wafers (cleaned, flattened, smoothed, and surface activated wafers), the direct bonding method proceeds to box 504. In box 504, three of the variable bonding parameters are configured in accordance with the bonding recipe being used to bond the wafers. The three bonding parameters that are configured in box 504 comprise the chuck vacuum pressure, the upper chuck vacuum zones, and the lower chuck vacuum zones.

The chuck vacuum pressure is the strength of the vacuum that the vacuum chuck uses to hold the pre-processed wafers. The upper and lower chuck vacuum zones are the variable vacuum cavities of the vacuum chuck that can be configured to be either active or not. The configuration of which of the chuck vacuum zones are active corresponds to the amount of surface area of the pre-processed wafers that would be under vacuum. For example, the chuck vacuum zone configuration (or edge diagonal configuration) illustrated in FIG. 3B would correspond to approximately 50% of the surface area of the edge of the pre-processed wafer being under vacuum.

After configuring the bonding parameters of the vacuum chuck, the direct bonding method continues in box 506. In box 506, the pre-processed wafers (a pre-processed upper wafer and a pre-processed lower wafer) are placed in a wafer holder in a processing chamber of a wafer processing tool. In an embodiment, the pre-processed upper wafer is placed in an upper wafer holder that is a vacuum chuck, such as the vacuum chuck illustrated in FIGS. 3A-B. In an embodiment, the pre-processed lower wafer is placed in a lower wafer holder that is a vacuum chuck, such as the vacuum chuck illustrated in FIGS. 3A-B. The pre-processed upper wafer is placed such that the side to be bonded to the pre-processed lower wafer is facing downward towards the pre-processed lower wafer. In other words, the back of the pre-processed upper wafer is what contacts the upper wafer holder (upper vacuum chuck). The pre-processed lower wafer is placed such that the side to be bonded to the pre-processed upper wafer is facing upwards towards the pre-processed upper wafer. In other words, the back of the pre-processed lower wafer is what contacts the lower wafer holder (lower vacuum chuck).

After placing the pre-processed wafers into their corresponding wafer holders and configuring the chuck vacuum pressure, the upper chuck vacuum zones, and the lower chuck vacuum zones, the direct bonding method continues in box 508. In box 508, another bonding parameter is configured according to the bonding recipe being used in the direct bonding method. The bonding parameter configured in box 508 is the bond gap distance, which is the separation distance between the upper pre-processed wafer and the lower pre-processed wafer. The bond gap distance is illustrated as the distance d in FIG. 1A. Once the bond gap distance d is configured, the pre-processed wafers are brought to the separation distance specified by the bonding recipe.

Once the pre-processed wafers have been brought to a separation distance that is about the bond gap distance specified by the bonding recipe in box 508, the direct bonding method proceeds to box 510. In box 510, the two pre-processed wafers are aligned to a sub-micron accuracy by measurements of alignment performed by an optical device, e.g., an infrared scanner. This may be accomplished by moving the chucks with respect to one another until an alignment sensing algorithm has determined that the two pre-processed wafers are aligned within a sub-micron accuracy. This alignment process is a pertinent step for reducing linear overlay distortions. Without proper alignment of the two pre-processed wafers before bonding, linear overlay distortions will be the most significant contributions to the overlay distortions of the bonded wafer that is produced.

After aligning the pre-processed wafers in box 510, the direct bonding method may proceed to box 512. In box 512, another variable bonding parameter, i.e., striker pressure is configured according to the bonding recipe that is used. The striker pressure is the pressure at which the striker will exert to make direct (atomic) contact between the upper pre-processed wafer and the lower pre-processed wafer. Once the striker pressure is configured, the striker proceeds to make direct contact between the upper pre-processed wafer and the lower pre-processed wafer at a single point. In an embodiment, the striker strikes downwards from behind the middle of the pre-processed upper wafer, and pushes the center of the pre-processed upper wafer down to make direct contact with the pre-processed lower wafer. In an embodiment, the striker strikes downward from behind the edge of the pre-processed upper wafer, and pushes the edge of the pre-processed upper wafer down to make direct contact with the edge of the pre-processed lower wafer. In other embodiments, the pre-processed lower wafer is struck upward by the striker into the upper pre-processed wafer.

Starting the bonding process may be referred to as initiation. Once the wafers have made direct contact, a bonding front propagates across the surface of contact of the two wafers. In box 513, the vacuum zones are reduced/released in time with the bonding front as it propagates across the surface to bond the two wafers together. The bonding front is a wave that pushes whatever medium may be present between the two wafers out from between them and enables the bonds to form across the entire contact surface between the two wafers. The direct bonding between the surfaces of the pre-processed wafers is based on intermolecular interactions including van der Waals forces, hydrogen bonds, and strong covalent bonds.

Once the wafers have undergone initiation and the bonding front has fully propagated across the contact surface between the two wafers, the direct bonding method continues to box 514. In box 514, the bonded wafer is annealed to strengthen the bond formed between the upper and lower wafers. Annealing is accomplished by exposing the bonded wafer to a high temperature bake (hundreds of degrees Celsius, for example). By exposing the bonded wafers to a high temperature anneal, thermal energy is introduced to the system that causes the formation of more hydrogen bonds as well as increasing the area of contacted surfaces, so the diffusion of trapped hydrogen molecules along the interface is enhanced and interface voids may reduce in size or completely disappear. This may also lead to the condensation of hydrogen bonds, the creation of covalent bonds as well as increasing the contacted surfaces between the wafers, and the diffusion of trapped species into the bulk material may be enhanced. All of these increase the strength of the bond between the now annealed wafers. In some embodiments where copper electrical contacts are present at the bonding interface, metallic bonding may occur during the annealing step to create electrical connections across the bonding interface.

After annealing in box 514, an annealed wafer has been produced, which can now be examined to determine any overlay distortions present. In an embodiment, overlay distortions are measured using various techniques (such as infrared scanning) after the annealing process of a direct bonding method. In other embodiments, the overlay distortions are measured before annealing the bonded wafer, which enables examining overlay distortions that result from the bonding at room temperature step of the direct bonding method. It should be noted that the wafer bonding method of this disclosure is applicable regardless of whether the overlay distortions are measured before annealing or after annealing the bonded wafer.

The direct bonding method of FIG. 4 can utilize an optimized (minimized residuals) direct bonding recipe (or target process recipe) determined by using the wafer bonding method described by the subsequent steps of the flowchart of FIG. 5.

Referring back to FIG. 4, after bonding the two wafers in box 402 to make a bonded wafer, the method proceeds to box 404. In box 404, the overlay distortions of the bonded wafer are measured to determine the residuals of the bonded wafer. Determining the residuals of a bonded wafer comprises using a measuring device to examine a bonded wafer. As mentioned before, the residuals are the overlay distortions that result from nonlinear distortions. Once linear distortions are accounted for by the measuring device, the remaining distortions are assumed to be a result of nonlinear sources and are quantified and labeled residuals. Residuals are typically quoted as a certain number of standard deviations from alignment. For example, a bonded wafer may be measured and found to have residuals of three standard deviations in X of 41.72 nm and three standard deviations in Y of 55.16 nm for a particular direct bonding recipe. In this example, the residuals mean that 99.73% of the bonded wafer produced using the corresponding direct bonding recipe is within 41.72 nm in X and 55.16 nm in Y from no nonlinear distortions (or the bonded wafer being perfectly aligned).

Once the residuals are determined for the bonded wafer fabricated using the starting best known recipe in box 404, the wafer bonding method proceeds to box 406. In box 406, a new set of wafers are bonded using a new direct bonding recipe. The new direct bonding recipe is the same as the best known recipe except for a single bonding parameter that is varied. For example, instead of using a bond gap distance of 60 μm, the new recipe uses a bond gap distance of 40 μm. The determined residuals and the bonding parameters of the best known recipe are stored for use by an optimization algorithm.

The bonding parameters that are varied in the wafer bonding method of this disclosure comprise the bond gap distance, the striker pressure (which may be varied with time), the chuck vacuum pressure, the upper chuck vacuum zones, the lower chuck vacuum zones, and the timing of the release of the chuck vacuum zones to correspond with the movement of the bonding front during the bonding of the two wafers. The bond gap distance is the separation distance of the upper wafer from the lower wafer before the wafers are struck together using the striker. The configurable values of the bond gap distance typically vary from 5 μm to 1000 μm. The striker pressure is the pressure that the striker uses to press the upper wafer into the lower wafer (or vice versa)

at a single point to initiate the bonding front that bonds the two wafers together. The configurable values of the striker pressure typically vary from 0 kPa to 100 kPa, and the striker pressure can also be varied over time (different values with time). In an example embodiment, the value of the striker pressure may be reduced after the initial contact. The chuck vacuum pressure is the vacuum pressure that holds a wafer to be bonded to a vacuum chuck. The chuck vacuum pressure is the difference with atmospheric pressure, and thus the configurable values of the chuck vacuum pressure typically vary from 0 kPa to −100 kPa. The upper and lower chuck vacuum zones correspond to configurations of the vacuum cavities behind the vacuum chuck being active or not. As was noted above, there may be different rings of chuck vacuum zones (not just the outer ring) that are segmented from the center to the edge of the vacuum chuck, which are all configurable in some embodiments. Different configurations of the vacuum chuck zones are called all edge, edge diagonal only, or all, or more that incorporate different settings for various rings (not just the outer ring) of chuck vacuum zones. In the all edge configuration, the vacuum cavities of the edge of the vacuum chuck are all active, which corresponds to a 100% edge coverage (which is depicted in FIG. 3A). In the edge diagonal only configuration, only 30 to 50% of the vacuum cavities of the edge of the vacuum chuck are active (which is depicted in FIG. 3B). The all configuration corresponds to all of the vacuum cavities of the vacuum chuck being active, which corresponds to a 100% coverage of the entire surface area (not just the edge) of the wafer loaded in the vacuum chuck. The timing of the release of the chuck vacuum zones during the bonding process is also configurable, and corresponds to releasing the vacuum zones in time with the propagation of the bonding front across the surface of the wafers.

After fabricating a new bonded wafer using the new bonding recipe with a single varied bonding parameter in box 406, the wafer bonding method proceeds to box 408. In box 408, the residuals of the new bonded wafer fabricated in box 406 are measured. The determination of the residuals may comprise the same methods described in box 404, which will not be repeated here for the sake of brevity. The determined residuals and the bonding parameters of the new bonding recipe are stored for use by the optimization algorithm.

Once the residuals of the new bonded wafer have been determined, the wafer bonding method proceeds to box 410, which has two possible outcomes. In box 410, the wafer bonding method checks whether a set of bonded wafers have been fabricated using new recipes that each vary one of the bonding parameters. There are two possibilities in box 410, either YES or NO.

For the case that there has not been (or NO) a bonded wafer produced using a recipe that varies a single of the bonding parameters for all bonding parameters, the wafer bonding method proceeds back to box 406 to produce a new bonded wafer using a new direct bonding recipe that varies a single bonding parameter of the best known method that has not been varied by a prior recipe. After fabricating the new bonded wafer, the tuning wafer bonding method proceeds to box 408 where the residuals are determined for the new bonded wafer and stored along with the bonding parameters for use by the optimization algorithm. Then, the wafer bonding method proceeds to box 410 where the check is made again.

For the case that there has been (or YES) a bonded wafer produced using a recipe that varies a single of the bonding parameters for all bonding parameters, the wafer bonding method continues to box 412. In box 412, an optimization algorithm is employed to determine what variation of the bonding parameters minimizes residuals using the residuals of the prior recipes and bonding parameters corresponding to those residuals that were stored. In other words, the bonding parameters may be configured to minimize the residuals. Configuration of the bonding parameters may include setting a minimum and maximum for each of the bonding parameters. In one embodiment, the bond gap distance d is designed to be between 30 μm and 75 μm. In one embodiment, the bond gap distance d is designed to be between 50 μm and 75 μm. In one embodiment, the bond gap distance d is designed to be between 30 μm and 50 μm. In one embodiment, the bond gap distance d is designed to be less than 50 μm. In an embodiment, the upper vacuum condition is designed to include a vacuum surface area of the backside of the upper wafer to be at less than 50%, e.g., as low as 0.5% in an embodiment; and a vacuum level to be between 0 kPa and −100 kPa. In one embodiment, the upper vacuum condition is designed to have a vacuum surface area of the backside of the upper wafer to be between 30% and 50%. In one embodiment, the lower vacuum condition is designed to be less than −25 kPa. In one embodiment, the striker pressure condition is designed to be between 10 kPa and 25 kPa. In one embodiment, the lower vacuum condition is designed to have a second vacuum surface area of the backside of the lower wafer to be greater than 80%; and a vacuum level of the lower wafer to be between 0 kPa and −100 kPa. In various embodiments, the ratio of active to inactive zones may be used as a bonding parameter. In FIG. 3B, this ratio is about 50% but in other embodiments, this ratio may be designed to vary between 0% and 100%, or 20% to 80% as an example.

The optimization algorithm may be a linear programming algorithm, a genetic algorithm, random forest algorithm, a regression algorithm, or other techniques. Once the optimization algorithm has determined the set of bonding parameters that minimizes residuals in bonded wafers, the set of bonding parameters are returned as a target (tuned or calibrated) direct bonding recipe.

After determining the tuned direct bonding recipe in box 412, the wafer bonding method proceeds to box 414. In box 414, the target direct bonding recipe may now be used by the wafer processing tool to produce future bonded wafers with minimized residuals. It should be noted that the wafer bonding method is applicable to any wafer processing tool that bonds wafers using a direct bonding method with a striker. As a result, the wafer bonding method can optimize bonding recipes used in existing wafer processing tools to minimize residuals in bonded wafers.

The version of the wafer bonding method of FIG. 4 can be described as a linear calibration tuning wafer bonding method, where the tuned wafer bonding recipe is determined once and then used for future wafer fabrication. In other words, the direct bonding recipe of the wafer processing tool is calibrated to minimize residuals. In an embodiment, the wafer bonding method may be an adaptive calibration, where the direct bonding recipe of the wafer processing tool is calibrated and refined every time a bonded wafer is fabricated. The adaptive tuning wafer bonding method is illustrated in FIG. 6.

Figure 6:
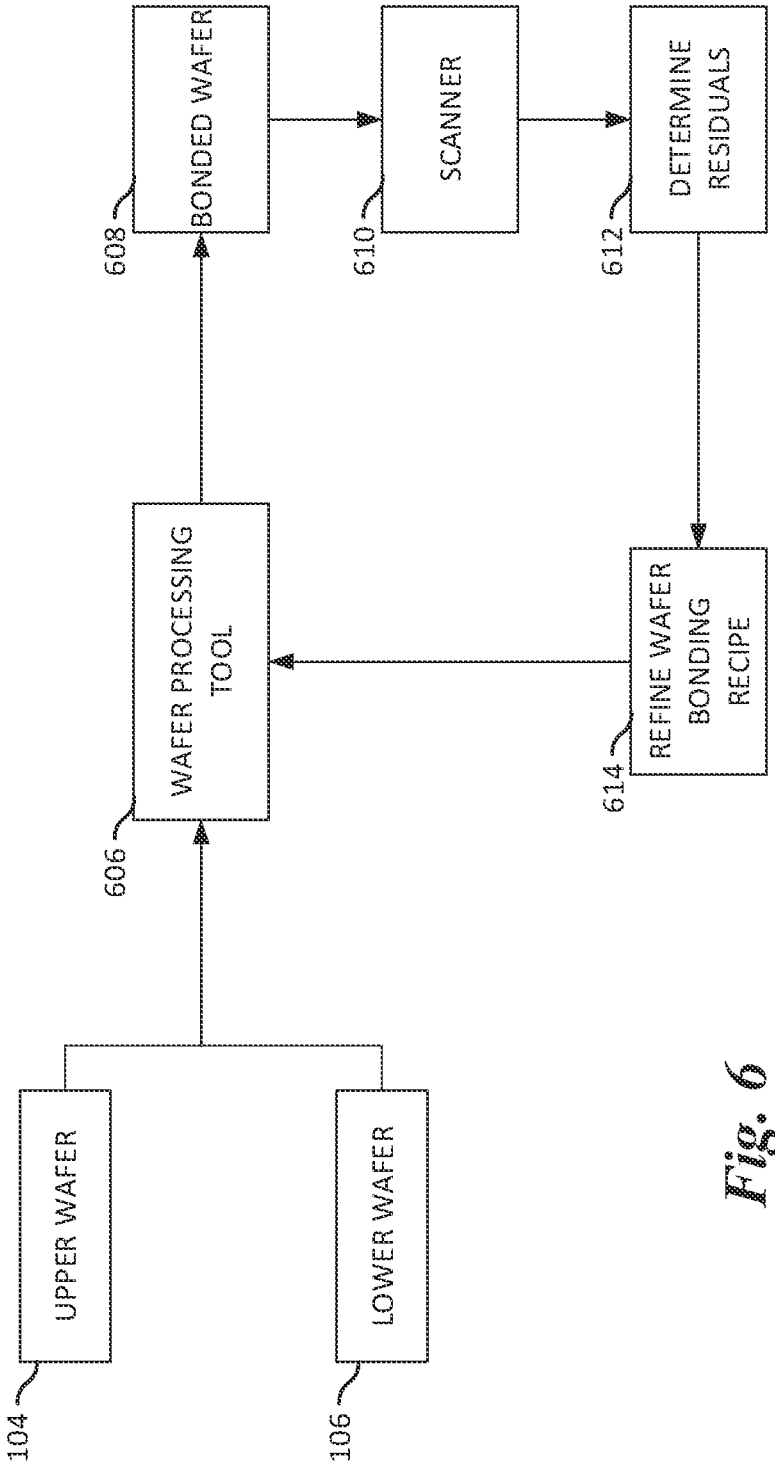
FIG. 6 is a flowchart of an adaptive wafer bonding method to reduce overlay distortions in accordance with embodiments.

FIG. 6 is a flowchart of an adaptive tuning wafer bonding method to reduce overlay distortions. The adaptive tuning wafer bonding method begins with a pair of pre-processed wafers (the upper wafer 104 and the lower wafer 106). The pre-processed wafers are placed inside of the wafer processing tool 606, and the wafer processing tool will bond the pre-processed upper wafer 602 and the pre-processed lower wafer 106 together using a direct bonding method (such as the direct bonding method illustrated in FIG. 5) that initially uses a best known direct bonding recipe.

The wafer processing tool 606 fabricates a bonded wafer 608. The bonded wafer 608 is then scanned using a scanner 610 to measure overlay distortions. The scanner 610 may be any type of scanner that is capable of measuring overlay distortions, such as an infrared scanner. This may be accomplished by using the scanner 610 to generate a distortion map that can be used by an optimization algorithm.

After the bonded wafer 608 has been scanned with the scanner 610, the residuals are determined using the measured overlay distortions from the scanner 610. In box 612, the residuals are determined and then used to refine the wafer bonding recipe (box 614) in order to minimize the residuals.

The refined wafer bonding recipe is determined through the use of an optimization algorithm, which may be a linear programming algorithm, a genetic algorithm, random forest algorithm, a regression algorithm, or other techniques. In box 614, the refined (or tuned) wafer bonding recipe is determined and then communicated to the wafer processing tool 606 for it to use as the direct bonding recipe for the next bonded wafer fabricated using the direct bonding method.

Now back at the wafer processing tool 606, the wafer processing tool 606 uses the wafer bonding recipe to fabricate a new bonded wafer 608. The new bonded wafer 608 will then be scanned by the scanner 610, have the residuals of the bonded wafer determined in 612, and an optimization algorithm will again refine the direct wafer bonding recipe in 614. Thus, the wafer bonding method illustrated in FIG. 6 is an adaptive tuning wafer bonding method that produces a tuned wafer bonding recipe for each new bonded wafer fabricated, or for a group of wafers.

Figure 7:
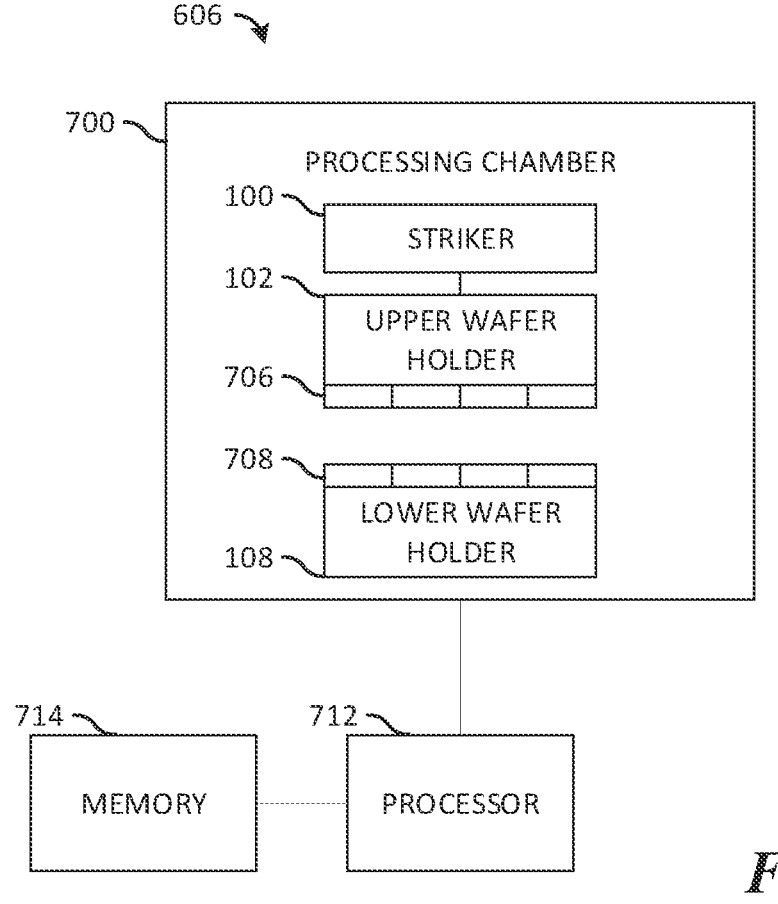
FIG. 7 is an embodiment system diagram of a wafer processing tool implementing the wafer bonding methods of this disclosure.

A system diagram of the wafer processing tool 606 that may be used to implement either the linear calibration or the adaptive tuning wafer bonding methods of FIGS. 4 and 6 is illustrated in FIG. 7.

FIG. 7 is a system diagram of a wafer processing tool 606 that can implement the tuning wafer bonding method of this disclosure to bond pre-processed wafers. The wafer processing tool 606 comprises a processing chamber 700 that has a striker 100, an upper wafer holder 102, an upper wafer holder vacuum zones 706, a lower wafer holder 108, a lower wafer holder vacuum zones 708. The processing chamber 700 is connected to a processor 712, and a memory 714.

The processing chamber 700 is where the direct bonding method is used to bond a set of pre-processed wafers. The processing chamber 700 provides a controlled environment, such as temperature, atmospheric pressure, gas inlets and outlets, and so forth. In an embodiment, the processing chamber 700 includes all of the elements necessary for performing the bonding of the pre-processed wafers, such as the striker 100, the upper wafer holder 102 and the upper wafer holder vacuum zones 706, the lower wafer holder 108 and the lower wafer holder vacuum zones 708.

The striker 100 is a tool used to establish the physical contact between the two pre-processed wafers by applying a configurable amount of pressure, called the striker pressure. In an embodiment, the striker is positioned within the upper wafer holder 102, and can be pushed down through the upper wafer holder 102 to exert pressure on a pre-processed upper wafer to push it down into direct contact with a pre-processed lower wafer. In an embodiment, the striker 100 is positioned within the lower wafer holder 108, and can be pushed upwards through the lower wafer holder 108 to exert pressure on a pre-processed lower wafer to push it up into direct contact with a pre-processed upper wafer.

The upper wafer holder 102 is a device to hold a wafer during the bonding process of the wafer processing tool 606. In an embodiment, the upper wafer holder 102 may include a chuck such as the vacuum chuck discussed in FIGS. 3A-3B. A vacuum chuck holds a wafer by using a vacuum to pump the air out of cavities located behind the vacuum chuck so that air pressure will hold the wafer in place. The cavities of the vacuum chuck are called the vacuum zones, such as the upper wafer holder vacuum zones 706, and different zones can be configured to be active or not. In an embodiment, the upper wafer vacuum zones can be configured to have all zones on, such as in FIG. 3A. In another embodiment, the upper wafer vacuum zones 710 can be configured such that only half of the edge chuck vacuum zones are active and the others are not, such as in FIG. 3B.

The lower wafer holder 108 is a device to hold a wafer during the bonding process of the wafer processing tool 606. In an embodiment, the lower wafer holder 108 may be a vacuum chuck. A vacuum chuck holds a wafer by using a vacuum to pump the air out of cavities located behind the vacuum chuck so that air pressure will hold the wafer in place. The cavities of the vacuum chuck are called the vacuum zones, such as the lower wafer holder vacuum zones 708, and different zones can be configured to be active or not. In an embodiment, the lower wafer vacuum zones can be configured to have all zones on, such as in FIG. 3A. In another embodiment, the lower wafer holder vacuum zones 708 can be configured such that only half of the chuck vacuum zones are active and the others are not, such as in FIG. 3B.

The processor 712 may be any device that can execute instructions stored in the memory 714 to bond wafers in the wafer processing tool 606. The processor 712 is capable of executing the wafer bonding method of this disclosure to tune the wafer bonding recipe used by the wafer processing tool 606. The processor 712 issues the processing conditions (bonding parameters) of the wafer bonding recipe to the processing chamber 700. The processor 712 also implements the optimization algorithm to tune the wafer bonding recipe to minimize residuals by using the residuals and bonding parameters of a collection of recipes that are stored in memory 714. The processor 712 may be a single processor with multiple cores or a plurality of processors including that of a distributed computing system.

The memory 714 may be any device that can store instructions to be executed by the processor 712 and store overlay distortion measurements (such as the determined residuals and bonding parameters used in a particular direct bonding recipe) to be used in the optimization algorithm to determine a tuned direct bonding recipe. The memory 714 may also store the tuning wafer bonding method instructions for execution by the processor 712. The memory 714 may also be used to store the distortion map generated by a scanner. The memory 714 may include both non-volatile memory and volatile memory. Some of the instructions may be stored in different parts of the memory, which may be stored at different systems.

By implementing the wafer bonding method of this disclosure in a wafer processing tool 606 (like the one illustrated in FIG. 7), a tuned wafer bonding recipe is determined that minimizes residuals. Through the minimization of residuals in overlay distortions, semiconductor manufacturers can increase device yield without increasing fabrication costs.

FIG. 8 illustrates a flow chart illustrating embodiments of the present disclosure.

In an embodiment, a method includes determining an upper vacuum condition, a lower vacuum condition, a bonding gap distance, and a striker pressure condition based on measuring residual distortions from a previously bonded wafer (box 802). The method further includes applying the upper vacuum condition to an upper wafer using an upper wafer holder, the upper vacuum condition applied to a backside of the upper wafer, and the upper wafer having a front side being opposite of the backside (box 804). The method further includes applying the lower vacuum condition to a lower wafer using a lower wafer holder, the lower vacuum condition applied to a backside of the lower wafer, and the lower wafer having a front side being opposite of the backside (box 806). The method further includes positioning the front side of the upper wafer over the front side of the lower wafer to create the bonding gap distance between the upper wafer and the lower wafer (box 808). And the method further includes striking the backside of the upper wafer with a striker using the striker pressure condition to bond the front side of the upper wafer and the front side of the lower wafer together (box 810).

The various boxes described above may be implemented as further described using FIG. 4 and FIG. 5. For example, in an embodiment, box 810 may be implemented as box 402 in FIG. 4. As another example, in an embodiment, box 808 may be implemented as box 508 in FIG. 5.

FIG. 9 illustrates a flow chart illustrating embodiments of the present disclosure.

In an embodiment, a method includes forming a first plurality of bonded wafers using a plurality of process recipes (box 902). The forming includes, for each one of the first plurality of bonded wafers, striking a backside of a first wafer with a striker to bond the first wafer to a second wafer, each of the first plurality of bonded wafers being formed using a different one of the plurality of process recipes (904). The method further includes measuring overlay distortions for each of the first plurality of bonded wafers, and based thereon determining residual overlay distortions for each of the first plurality of bonded wafers (box 906). The method further includes selecting one of the first plurality of bonded wafers with a lower value of the residual overlay distortions (box 908). The method further includes determining a target process recipe associated with forming the selected one of the first plurality of bonded wafers (box 910). And the method further includes forming a second plurality of bonded wafers using the target process recipe (box 912).

The various boxes described above may be implemented as further described using FIG. 4. For example, in an embodiment, box 904 may be implemented as box 406 in FIG. 4.

FIG. 10 illustrates a flow chart illustrating embodiments of the present disclosure.

In an embodiment, a method includes forming a plurality of bonded wafers by performing a cycle of bonding (box 1002). Each cycle includes receiving a wafer set to be bonded, the wafer set comprising a first wafer and a second wafer (box 1004). Each cycle further includes measuring an overlay distortion of a previous bonded wafer, and based thereon determining a residual overlay distortion of the previous bonded wafer (box 1006). Each cycle further includes determining a process recipe based on the previous residual overlay distortion (box 1008). Each cycle further includes positioning the first wafer to align with the second wafer and being separated by a bond gap distance (box 1010). And each cycle further includes striking a backside of the first wafer with a striker to bond the first wafer and the second wafer together to form a bonded wafer (box 1012).

The various boxes described above may be implemented as further described using FIG. 6. For example, in an embodiment, box 1008 may be implemented as box 614 in FIG. 6.

Example embodiments of the invention are described below. Other embodiments can also be understood from the entirety of the specification as well as the claims filed herein.

Example 1. A method includes determining an upper vacuum condition, a lower vacuum condition, a bonding gap distance, and a striker pressure condition based on measuring residual distortions from a previously bonded wafer. The method includes applying the upper vacuum condition to an upper wafer using an upper wafer holder, the upper vacuum condition applied to a backside of the upper wafer, and the upper wafer having a front side being opposite of the backside. The method includes applying the lower vacuum condition to a lower wafer using a lower wafer holder, the lower vacuum condition applied to a backside of the lower wafer, and the lower wafer having a front side being opposite of the backside. The method includes positioning the front side of the upper wafer over the front side of the lower wafer to create the bonding gap distance between the upper wafer and the lower wafer. And the method includes striking the backside of the upper wafer with a striker using the striker pressure condition to bond the front side of the upper wafer and the front side of the lower wafer together.

Example 2. The wafer bonding method of example 1, where applying the upper vacuum condition includes applying vacuum to a first vacuum surface area at a first vacuum level, the first vacuum surface area being between 0.1% and 5% of a total area of the backside of the upper wafer and the first vacuum level being between 0 kPa and −100 kPa. The wafer bonding method of example 1, where applying the lower vacuum condition includes applying vacuum to a second vacuum surface area at a second vacuum level, the second vacuum surface area being between 80% and 100% of a total area of the backside of the lower wafer, the second vacuum level being between 0 kPa and −100 kPa. The wafer bonding method of example 1 where the striker pressure condition is between 10 kPa and 25 kPa. And the wafer bonding method of example 1 where the bonding gap distance is between 30 μm and 75 μm.

Example 3. The wafer bonding method of one of examples 1 or 2, where the bonding gap distance is between 50 μm and 75 μm, the bonding gap distance is between 30 μm and 50 μm, or the bonding gap distance is less than 50 μm.

Example 4. The wafer bonding method of one of examples 1 to 3, where the lower vacuum condition is less than −25 kPa.

Example 5. The wafer bonding method of one of examples 1 to 4, where the upper vacuum condition includes a first vacuum surface area of a total area of the backside of the upper wafer being less than 50%.

Example 6. The wafer bonding method of one of examples 1 to 5, further including an annealing process to strengthen the bond of the upper wafer and lower wafer, the annealing process including exposing the bonded upper wafer and lower wafer to a temperature over 100° C.

Example 7. A method includes forming a first plurality of bonded wafers using a plurality of process recipes, the forming includes for each one of the first plurality of bonded wafers, striking a backside of a first wafer with a striker to bond the first wafer to a second wafer, each of the first plurality of bonded wafers being formed using a different one of the plurality of process recipes. The method includes measuring overlay distortions for each of the first plurality of bonded wafers, and based thereon determining residual overlay distortions for each of the first plurality of bonded wafers. The method includes selecting one of the first plurality of bonded wafers with a lower value of the residual overlay distortions. The method includes determining a target process recipe associated with forming the selected one of the first plurality of bonded wafers. And the method includes forming a second plurality of bonded wafers using the target process recipe.

Example 8. The method of example 7, where each one of the plurality of process recipes is different from another one of the plurality of process recipes in only one bonding parameter.

Example 9. The method of one of examples 7 or 8, further includes applying a first vacuum condition to the first wafer using an upper wafer holder, the first vacuum condition applied to a backside of the first wafer, and the first wafer having a front side being opposite of the backside. The method further includes applying a second vacuum condition to a second wafer using a second wafer holder, the second vacuum condition applied to a backside of the second wafer, and the second wafer having a front side being opposite of the backside. And the method further includes positioning the front side of the second wafer over the front side of the second wafer to create a bonding gap distance between the first wafer and the second wafer, where the striking is performed at a striker pressure condition to bond the first wafer with the second wafer.

Example 10. The method of one of examples 7 to 9, where each of the plurality of process recipes includes the first vacuum condition, the second vacuum condition, the bonding gap distance, and the striker pressure condition.

Example 11. The method of one of examples 7 to 10, where applying the first vacuum condition includes having a plurality of chuck vacuum zones, each having a vacuum level, and activating a subset of chuck vacuum zones around the first wafer during the forming.

Example 12. The method of one of examples 7 to 11, where applying the first vacuum condition includes having a plurality of chuck vacuum zones, where the vacuum level of adjacent ones of the chuck vacuum zones is different during the forming.

Example 13. The method of one of examples 7 to 12, further includes receiving, at a process controller, the target process recipe, and based on the target process recipe, activating a plurality of chuck vacuum zones in the first wafer holder and the second wafer holder.

Example 14. The method of one of examples 7 to 13, further includes receiving, at a process controller, the target process recipe, and based on the target process recipe, changing the striker pressure condition of the striker.

Example 15. The tuning wafer bonding method of one of examples 7 to 14, further includes annealing the bonded wafer, where the measuring overlay distortions is performed after the annealing.

Example 16. A method includes forming a plurality of bonded wafers by performing a cycle of bonding, each cycle includes receiving a wafer set to be bonded, the wafer set including a first wafer and a second wafer. Each cycle includes measuring an overlay distortion of a previous bonded wafer, and based thereon determining a residual overlay distortion of the previous bonded wafer. Each cycle includes determining a process recipe based on the previous residual overlay distortion. Each cycle includes positioning the first wafer to align with the second wafer and being separated by a bond gap distance. And each cycle includes striking a backside of the first wafer with a striker to bond the first wafer and the second wafer together to form a bonded wafer.

Example 17. The method of example 16, where the striking includes striking a central portion of the first wafer.

Example 18. The method of one of examples 16 or 17, where the striking includes striking a peripheral region of the first wafer.

Example 19. The method of one of examples 16 to 18, where the measuring includes scanning the bonded wafer with an infrared scanner and generating a distortion map.

Example 20. The method of one of examples 16 to 19, where determining the process recipe includes having a distortion model for the bonded wafer, generating a residual distortion map from the distortion map, and based on the distortion model, the process recipe, and the residual distortion map, select a new process recipe to minimize residual distortion, the process recipe including a value for the bond gap distance and a pressure at which the striker strikes the first wafer.

Example 21. The method of one of examples 16 to 20, further includes applying a first vacuum condition to the first wafer using a first wafer holder, the first vacuum condition applied to a backside of the first wafer, and the first wafer having a front side being opposite of the backside. And the method further includes applying a second vacuum condition to the second wafer using a second wafer holder, the second vacuum condition applied to a backside of the second wafer, and the second wafer having a front side being opposite of the backside, where the process recipe includes the first vacuum condition and the second vacuum condition.

Example 22. The method of one of examples 16 to 21, where each cycle further includes annealing the bonded wafer.

Example 23. The method of one of examples 16 to 22, where the annealing is performed at a temperature over 150° C.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:

determining an upper vacuum condition, a lower vacuum condition, a bonding gap distance, and a striker pressure condition based on measuring residual distortions from a previously bonded wafer;

applying the upper vacuum condition to an upper wafer using an upper wafer holder by applying vacuum to a first vacuum surface area at a first vacuum level, the upper vacuum condition applied to a backside of the upper wafer, and the upper wafer having a front side being opposite of the backside, the first vacuum surface area being between 0.1% and 5% of a total area of the backside of the upper wafer, the first vacuum level being between 0 kPa and −100 kPa;

applying the lower vacuum condition to a lower wafer using a lower wafer holder by applying vacuum to a second vacuum surface area at a second vacuum level, the lower vacuum condition applied to a backside of the lower wafer, and the lower wafer having a front side being opposite of the backside, the second vacuum surface area being between 80% and 100% of a total area of the backside of the lower wafer, the second vacuum level being between 0 kPa and −100 kPa;

positioning the front side of the upper wafer over the front side of the lower wafer to create the bonding gap distance between the upper wafer and the lower wafer; and striking the backside of the upper wafer with a striker using the striker pressure condition to bond the front side of the upper wafer and the front side of the lower wafer together.

2. The method of claim 1,
wherein the striker pressure condition is between 10 kPa and 25 kPa; and
wherein the bonding gap distance is between 30 μm and 75 μm.

3. The method of claim 1, wherein the lower vacuum condition is less than-25 kPa.

4. The method of claim 1, further comprising performing an annealing process to strengthen the bond of the upper wafer and lower wafer, the annealing process comprising exposing the upper wafer and lower wafer to a temperature over 100° C. after the striking.

5. A method comprising:
forming a first plurality of bonded wafers using a plurality of process recipes, the forming comprising, for each one of the first plurality of bonded wafers, striking a backside of a first wafer with a striker to bond the first wafer to a second wafer, each of the first plurality of bonded wafers being formed using a different one of the plurality of process recipes, the first wafer being held by an upper wafer holder by applying vacuum to a first vacuum surface area at a first vacuum level, the first vacuum surface area being between 0.1% and 5% of a total area of the backside of the first wafer, the first vacuum level being between 0 kPa and −100 kPa, the second wafer being held by a lower wafer holder by applying vacuum to a second vacuum surface area at a second vacuum level, the second vacuum surface area being between 80% and 100% of a total area of a backside of the second wafer, the second vacuum level being between 0 kPa and −100 kPa;

measuring overlay distortions for each of the first plurality of bonded wafers, and based thereon determining residual overlay distortions for each of the first plurality of bonded wafers;

selecting one of the first plurality of bonded wafers with a lower value of the residual overlay distortions;

determining a target process recipe associated with forming the selected one of the first plurality of bonded wafers; and forming a second plurality of bonded wafers using the target process recipe.

6. The method of claim 5, wherein each one of the plurality of process recipes is different from another one of the plurality of process recipes in only one bonding parameter.

7. The method of claim 5, further comprising:
applying a first vacuum condition to the first wafer using the upper wafer holder, the first vacuum condition applied to the backside of the first wafer, and the first wafer having a front side being opposite of the backside;

applying a second vacuum condition to a second wafer using the lower wafer holder, the second vacuum condition applied to the backside of the second wafer, and the second wafer having a front side being opposite of the backside; and positioning the front side of the second wafer over the front side of the first wafer to create a bonding gap distance between the first wafer and the second wafer, wherein the striking is performed at a striker pressure condition to bond the first wafer with the second wafer.

8. The method of claim 7, wherein each of the plurality of process recipes comprises the first vacuum condition, the second vacuum condition, the bonding gap distance, and the striker pressure condition.

9. The method of claim 8, wherein applying the first vacuum condition comprises
having a plurality of chuck vacuum zones, each having a vacuum level; and
activating a subset of chuck vacuum zones around the first wafer during the forming.

10. The method of claim 8, wherein applying the first vacuum condition comprises having a plurality of chuck vacuum zones, each having a vacuum level, wherein the vacuum level of adjacent ones of the chuck vacuum zones is different during the forming.

11. The method of claim 7, further comprising:
receiving, at a process controller, the target process recipe; and
based on the target process recipe, activating a plurality of chuck vacuum zones in the upper wafer holder and the lower wafer holder.

12. The method of claim 7, further comprising:
receiving, at a process controller, the target process recipe; and
based on the target process recipe, changing the striker pressure condition of the striker.

13. The method of claim 7, further comprising annealing the first plurality of bonded wafers, wherein the measuring overlay distortions is performed after the annealing.

14. A method comprising:
forming a plurality of bonded wafers by performing a cycle of bonding, each cycle comprising:
receiving a wafer set to be bonded, the wafer set comprising a first wafer and a second wafer, the first wafer being held by a first wafer holder by applying vacuum to a first vacuum surface area at a first vacuum level, the first vacuum surface area being formed by activating a subset of chuck vacuum zones of the first wafer holder disposed around an outer edge of the first wafer, the second wafer being held by a second wafer holder by applying vacuum to a second vacuum surface area at a second vacuum level, measuring an overlay distortion of a previous bonded wafer, and based thereon determining a residual overlay distortion of the previous bonded wafer, determining a process recipe based on the previous residual overlay distortion, positioning the first wafer to align with the second wafer and being separated by a bond gap distance, and striking the backside of the first wafer with a striker to bond the first wafer and the second wafer together to form a bonded wafer.

15. The method of claim 14, wherein the striking comprises striking a central portion of the first wafer.

16. The method of claim 14, wherein the striking comprises striking a peripheral region of the first wafer.

17. The method of claim 14, wherein the measuring comprises scanning the previous bonded wafer with an infrared scanner and generating a distortion map.

18. The method of claim 14, wherein determining the process recipe comprises:

having a distortion model for the previous bonded wafer;

generating a residual distortion map from the residual overlay distortion; and based on the distortion model, the process recipe, and the residual distortion map, select a new process recipe to minimize residual distortion, the new process recipe comprising a value for the bond gap distance and a pressure at which the striker strikes the first wafer.

19. The method of claim 14, wherein the process recipe comprises the first vacuum level and the second vacuum level.

20. The method of claim 14, wherein each cycle further comprises annealing the bonded wafer.

21. The method of claim 14, wherein the activated subset of chuck vacuum zones of the first wafer holder alternate with non-activated chuck vacuum zones around the outer edge of the first wafer.

\* \* \* \* \*